(12) United States Patent
Naiini et al.

(10) Patent No.: US 7,101,652 B2
(45) Date of Patent: Sep. 5, 2006

(54) PHOTOSENSITIVE RESIN COMPOSITIONS

(75) Inventors: Ahmad A. Naiini, East Greenwich, RI (US); Ilya Rushkin, Walpole, MA (US); Richard Hopla, Cranston, RI (US); Donald Racicot, Providence, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 28 days.

(21) Appl. No.: 10/796,587

(22) Filed: Mar. 9, 2004

(65) Prior Publication Data

US 2004/0249110 A1    Dec. 9, 2004

Related U.S. Application Data

(60) Provisional application No. 60/453,679, filed on Mar. 11, 2003, provisional application No. 60/453,623, filed on Mar. 11, 2003.

(51) Int. Cl.
    G03F 7/023    (2006.01)
    G03F 7/30     (2006.01)

(52) U.S. Cl. .......... 430/190; 430/18; 430/191; 430/192; 430/193; 430/326; 528/335; 528/338; 528/339; 528/340; 528/347; 528/348

(58) Field of Classification Search .......... 430/190, 430/191, 192, 193, 326, 18, 165; 528/335, 528/338, 339, 340, 347, 348
See application file for complete search history.

(56) References Cited

U.S. PATENT DOCUMENTS

| 4,371,685 A |   | 2/1983  | Ahne et al. ............ 528/73   |
| 4,395,482 A |   | 7/1983  | Ahne et al. ............ 430/326  |
| 4,622,285 A |   | 11/1986 | Ahne et al. ............ 430/322  |
| 5,037,720 A | * | 8/1991  | Khanna ................. 430/190  |
| 5,096,999 A |   | 3/1992  | Hellmut et al. ......... 528/182  |
| 5,376,499 A |   | 12/1994 | Hammerschmidt et al. . 430/192   |
| 5,449,584 A | * | 9/1995  | Banba et al. ............ 430/190 |
| 5,726,279 A |   | 3/1998  | Sezi et al. ............ 528/310  |
| 5,783,654 A |   | 7/1998  | Sezi et al. ............ 528/310  |
| 5,883,221 A |   | 3/1999  | Sezi et al. ............ 528/327  |
| 5,922,825 A |   | 7/1999  | Sezi et al. ............ 528/310  |
| 5,973,202 A |   | 10/1999 | Sezi et al. ............ 564/134  |
| 6,071,666 A | * | 6/2000  | Hirano et al. .......... 430/191  |
| 6,120,970 A |   | 9/2000  | Sezi et al. ............ 430/192  |
| 6,127,086 A |   | 10/2000 | Waterson et al. ....... 430/190   |
| 6,153,350 A |   | 11/2000 | Sezi et al. ............ 430/192  |
| 6,177,225 B1|   | 1/2001  | Weber et al. ........... 430/190  |
| 6,376,151 B1|   | 4/2002  | Takahashi et al. ...... 430/192   |
| 6,607,865 B1|   | 8/2003  | Makabe et al. ......... 430/191   |
| 2004/0229167 A1| * | 11/2004 | Naiini et al. ....... 430/283.1 |

FOREIGN PATENT DOCUMENTS

| JP | 11-109620  | 4/1999  |
| JP | 11-109635  | 4/1999  |
| JP | 11-258795  | 9/1999  |
| JP | 2000-302863| 10/2000 |
| JP | 2001-100416| 4/2001  |
| JP | 2002-020484| 1/2002  |
| JP | 2002-053664| 2/2002  |

OTHER PUBLICATIONS

Jan Rabek, Experimental Methods in Polymer Chemistry, John Wiley & Sons, New York, 1983. (This reference is a book).

* cited by examiner

Primary Examiner—John S. Chu
(74) Attorney, Agent, or Firm—Ohlandt, Greeley, Ruggiero & Perle, LLP

(57) ABSTRACT

New photosensitive PBO precursor polymers which contain diazoquinone moieties attached to its backbone and in which all amino end groups are converted into amide groups. The photosensitive formulation based on the disclosed PBO precursor polymers have good imaging and mechanical properties as well as superior shelf life stability.

Photosensitive polybenzoxazole precursor polymers having (sulfon)amide end groups (with or without attached diazoquinone groups) can be formulated into photosensitive compositions with diazoquinone photoactive compounds which lack benzylic hydrogens on the backbone to yield compositions producing films significantly lighter in color after curing.

79 Claims, No Drawings

PHOTOSENSITIVE RESIN COMPOSITIONS

RELATED APPLICATIONS

This application claims priority from U.S. Provisional Patent Application Nos. 60/453,679 and 60/453,623, both filed Mar. 11, 2003.

FIELD OF THE INVENTION

The present invention relates to positive photosensitive resin compositions. More specifically, the present invention relates to novel polybenzoxazole (PBO) precursor polymers, positive-working, aqueous base developable photosensitive polybenzoxazole (PBO) precursor compositions based on said polymers, a process of use for said photosensitive composition, and electronic parts produced by said process of use.

BACKGROUND OF THE INVENTION

In microelectronic applications, polymers that demonstrate high temperature resistance are generally well known. Precursors of such polymers, such as polyimides and polybenzoxazoles can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Conventional positive-working photosensitive polybenzoxazoles (PBO) contain an alkaline soluble PBO precursor and a diazoquinone photoactive compound as shown in U.S. Pat. No. 4,371,685. The diazoquinone compound inhibits the solubility of the PBO precursor in an aqueous base. After exposure to light, the diazoquinone compound undergoes photolysis and converts to indenecarboxylic acid, which promotes the aqueous base solubility of the PBO precursor.

The PBO precursors disclosed in U.S. Pat. No. 4,371,685 have amino end groups. Amino groups are known to cause decomposition of diazoquinone moieties (see for example Arnost Reiser, Photoreactive Polymer, John Wiley and Sons, Inc, 1989) which limits the shelf life of the photosensitive formulations based on PBO precursors and diazoquinone compounds.

In order to remedy this problem it was proposed in U.S. Pat. No. 6,376,151 B1 to convert amino end groups of PBO precursor into amide groups mostly through the reaction with various anhydrides or sulfonyl chlorides. In many cases it was demonstrated that the shelf life of formulations based on such modified PBO precursors is indeed substantially better than the shelf life of formulations based on PBO precursors containing amino end groups.

It was shown furthermore that the attachment of some diazoquinone moieties directly to the PBO precursor backbone, as disclosed in U.S. Pat. No. 6,177,225 B1 and U.S. Pat. No. 6,127,086, dramatically improves such lithographic properties of the positive-working photosensitive formulations as contrast and photospeed. However, these PBO precursors still have amino end groups, which also put limitations on the shelf life of their photosensitive formulations.

Cured PBO formulations are typically dark in color because of the myriad of high temperature reactions which take place during the high temperature cure. Unfortunately, the color of cured films of the positive photosensitive formulations is important for alignment during wire bonding and other packaging and assembly operations. Lighter-colored, more transparent films offer significant advantages in alignment during wire bonding and other packaging and assembly operations. This can result in increased throughput and accuracy.

The present invention discloses new photosensitive PBO precursor, which contains diazoquinone moieties attached to its backbone and in which all amino end groups are converted into amide groups. This invention found that the applicable end groups could be of much wider variety than those identified in U.S. Pat. No. 6,376,151 B1. The photosensitive formulation based on the disclosed PBO precursor has good imaging and mechanical properties as well as superior shelf life stability.

Furthermore, we have surprisingly found that photosensitive polybenzoxazole precursor polymers having (sulfon) amide end groups (with or without attached diazoquinone groups) can be formulated into photosensitive compositions with diazoquinone photoactive compounds which lack benzylic hydrogens on the backbone to yield compositions producing films significantly lighter in color after curing. Previous patents disclosing positive polybenzoxazole photosensitive formulations using diazoquinone photoactive compounds which lack benzylic hydrogens on the PAC backbone did not disclose any report about the color of the resulting cured films of such formulations nor how to address the problem of dark cured film in PBO formulations. Such formulations are disclosed in U.S. Pat. Nos. 5,376,499, U.S. Pat. No. 5,726,279, U.S. Pat. No. 5,783,654, U.S. Pat. No. 5,883,221, U.S. Pat. No. 5,922,825, U.S. Pat. No. 5,973,202, U.S. Pat. No. 6,120,970 or U.S. Pat. No. 6,153,350, herein incorporated by reference.

SUMMARY OF THE INVENTION

The first embodiment of the present invention describes a polybenzoxazole precursor polymer with Structure I

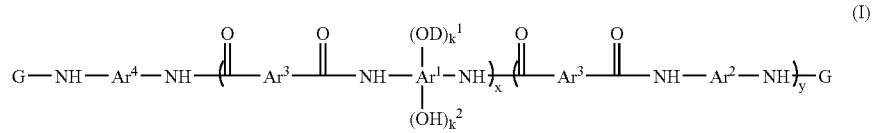

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1(OH)_2$ or $Ar^2$, x is from about 10 to about 1000; y is from 0 to about 900; D is one of the following moieties IIa–IIe:

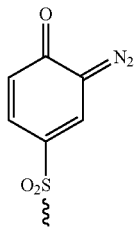
(IIa)

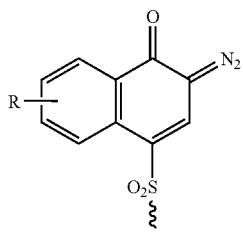
(IIb)

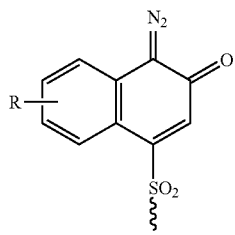
(IIe)

wherein, R is H, a $C_1$–$C_4$ alkyl group, a $C_1$–$C_4$ alkoxy group, or cyclohexyl. $k^1$ can be any positive value of up to about 0.5, $k^2$ can be any value from about 1.5 to about 2 with the proviso that $(k^1+k^2)=2$, x is from about 10 to about 1000; y is from about 0 to about 900; G is an organic group having a carbonyl, carbonyloxy or sulfonyl group attached directly to the terminal NH of the polymer.

In a second embodiment, the present invention provides a positive photosensitive resin composition comprising:

(a) at least one polybenzoxazole precursor polymer having Structure I or III;

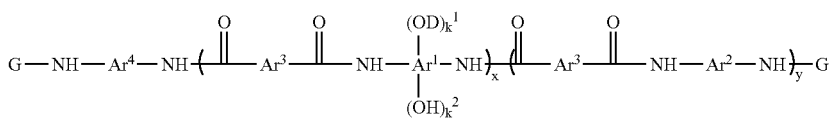
(I)

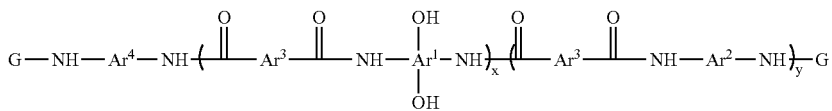
(III)

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon or mixtures thereof; $Ar^3$ is a divalent aromatic group, a divalent aliphatic group, a divalent heterocyclic group, or mixtures thereof; $Ar^4$ is $Ar^1(OH)_2$ or $Ar^2$; D is one of IIa–IIe as defined previously; $k^1$ can be any positive value of up to about 0.5, $k^2$ can be any value from about 1.5 to 2 with the proviso that $(k^1+k^2)=2$, x is from about 10 to about 1000; y is from about 0 to about 900; and G is an organic group having a carbonyl, carbonyloxy or sulfonyl group attached directly to the terminal NH of the polymer, (b) at least one non-polymeric photosensitive compound comprising a compound having within its structure one or more of moieties IIa–IIe, with: the proviso that if Structure III is the sole polybenzoxazole precursor polymer, the non-polymeric photosensitive compound is selected from the group consisting of compounds described by structures IV–VI, -continued

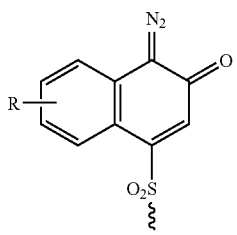
(IIc)

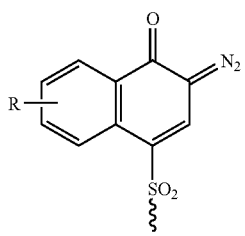
(IId)

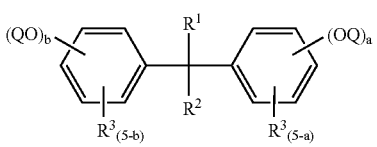
(IV)

-continued

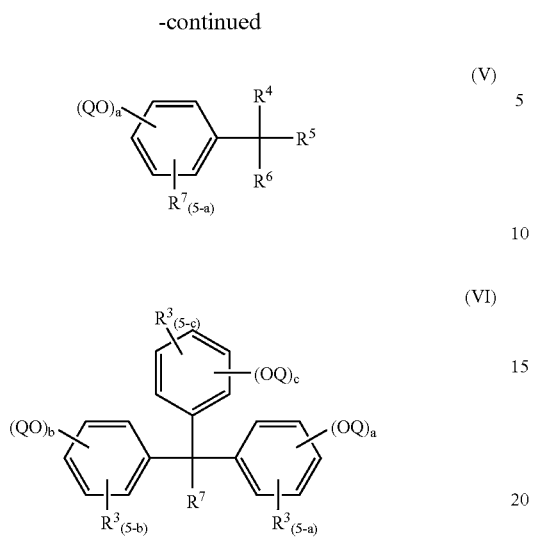

mer III is the sole resin, then the non-polymeric photosensitive compound is selected from the group of compounds described by Structures IV, V or VI as described before; and at least one solvent, thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

DETAILED DESCRIPTION OF THE INVENTION

One embodiment of the present invention describes a polybenzoxazole precursor polymer with structure I

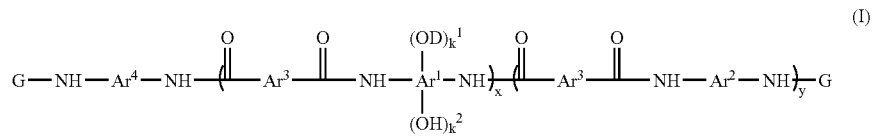

wherein $R^1$, $R^2$, $R^4$, $R^5$, $R^6$ and $R^7$ each independently are a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group or alternatively $R^1$ and $R^2$ or any two of $R^4$, $R^5$, and $R^6$ may together form a 5–7 membered ring; each $R^3$ is independently H, a linear or branched $C_1$–$C_4$ alkyl group, a phenyl or halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group or a phenyl or alkyl or halide substituted phenyl group; Q is H or D with the proviso that at least one Q=D; D is as defined hereinbefore; a is an integer from 1 to 5; b and c are integers from 0 to 5 with the provisos (1) that for Structure IV, if a=b=1 and both OQ are substituted para to the $R^1R^2C$ substituent, then both $R^1$ and $R^2$ are not simultaneously methyl and (2) 1<=a+b<6; and the proviso that for Structure VI, if a=b=c=1 and all OQ are para to the triphenyl methane carbon substituent, then at least one $R^3$ is not H; and (c) at least one solvent.

The present invention also provides a process for forming a relief pattern and electronic parts using the photosensitive composition. The process comprises the steps of:

(a) coating on a suitable substrate, a positive-working photosensitive composition comprising at least one polybenzoxazole precursor polymers having Structure I or III; at least one non-polymeric photosensitive compound comprising one or more of moieties IIa–IIe, with the proviso that if the polybenzoxazole precursor polywherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1$ $(OH)_2$ or $Ar^2$, x is from about 10 to about 1000; y is from 0 to about 900; D is one of the following moieties IIa–IIe:

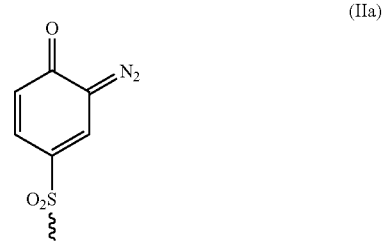

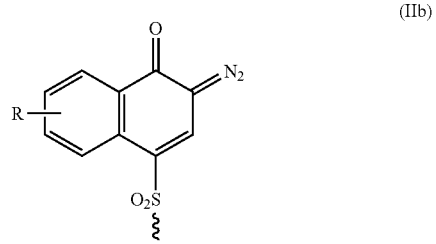

-continued

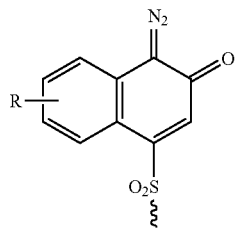
(IIc)

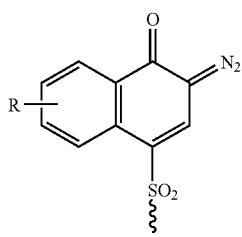
(IId)

-continued

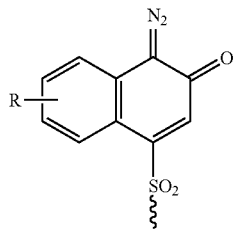
(IIe)

wherein, R is H, $C_1$–$C_4$ alkyl group, $C_1$–$C_4$ alkoxy group, or cyclohexyl. $k^1$ can be any positive value of up to about 0.5, $k^2$ can be any value from about 1.5 to about 2 with the proviso that $(k^1+k^2)=2$, x is from about 10 to about 1000; y is from about 0 to about 900; G is an organic group having a carbonyl, carbonyloxy or sulfonyl group attached directly to the terminal NH of the polymer.

The polybenzoxazole precursor polymers of Structure I may be synthesized in three steps. In the first step, monomers having Structures VII, VIII, and IX are reacted in the presence of a base to synthesize a polybenzoxazole precursor base polymer having Structure X.

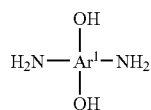
(VII)

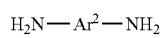
(VIII)

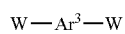
(IX)

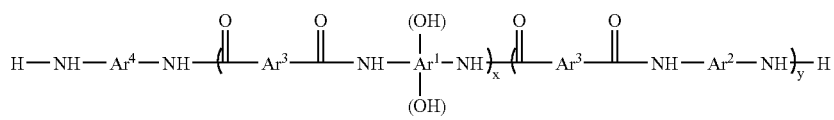
(X)

wherein $Ar^1$, $Ar^2$, $Ar^3$, x, and y are as previously defined, and W is C(O)Cl, COOH or COOR$^8$ and wherein $R^8$ is $C_1$–$C_7$ linear or branched alkyl group or a $C_5$–$C_8$ cycloalkyl group.

In the second synthesis step, the terminal amino groups of the polybenzoxazole precursor base polymer are reacted with a compound G—M, where G is as described before and M is a reactive leaving group, to produce a polybenzoxazole precursor polymer having Structure III. In the third step, polybenzoxazole precursor polymer having Structure III

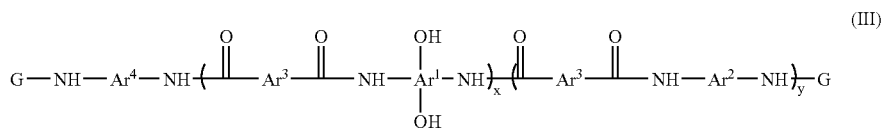
(III)

is reacted with a diazoquinone chloride in the presence of base to yield the polybenzoxazole precursor polymer having Structure I. In an alternative embodiment, the order of steps 2 and 3 may be reversed such that polybenzoxazole precursor polymer XI is employed.

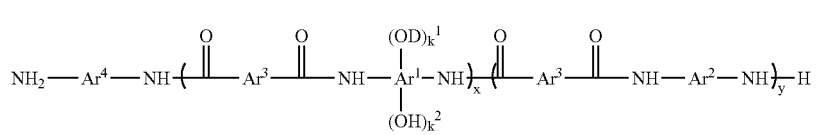

XI

In Structure VII, $Ar^1$ is a tetravalent aromatic or a tetravalent heterocyclic group. Examples of $Ar^1$ include but are not limited to:

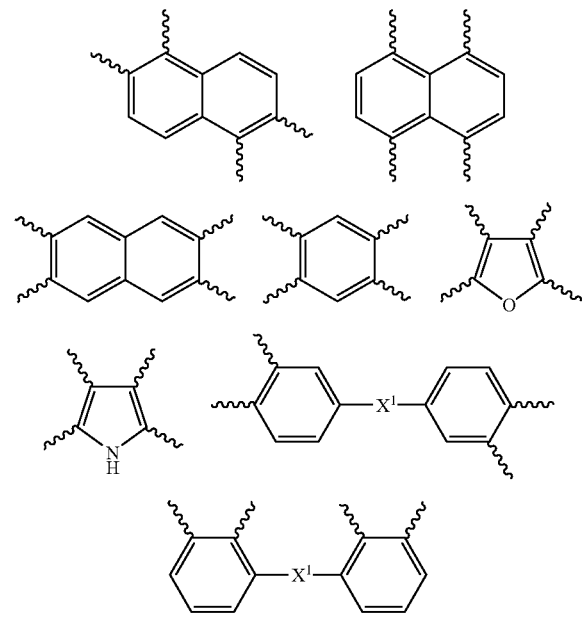

wherein $X^1$ is —O—, —S—, —C(CF$_3$)$_2$—, —CH$_2$—, —SO$_2$—, —NHCO— or —SiR$^9{}_2$— and each $R^9$ is independently a $C_1$–$C_7$ linear or branched alkyl or a $C_5$–$C_8$ cycloalkyl group. Examples of $R^9$ include, but are not limited to, CH$_3$, C$_2$H$_5$, n-C$_3$H$_7$, i-C$_3$H$_7$, n-C$_4$H$_9$, t-C$_4$H$_9$, and cyclohexyl.

Examples of monomers having the Structure VII containing $Ar^1$ include but are not limited to 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane. The substitution pattern of the two hydroxy and two amino groups in the monomer of Structure VII may be any of the possible substitution patterns with the proviso that the each amino group has an ortho relationship with a hydroxyl group in order to be able to form the benzoxaxole ring. Furthermore, the polybenzoxazole precursor base polymer X, may be synthesized using a mixture of two or more monomers described by generic Structure VII.

In Structure VIII, $Ar^2$ is a divalent aromatic, a divalent heterocyclic, a divalent alicyclic, or a divalent aliphatic group that may contain silicon. Examples of $Ar^2$ include but are not limited to:

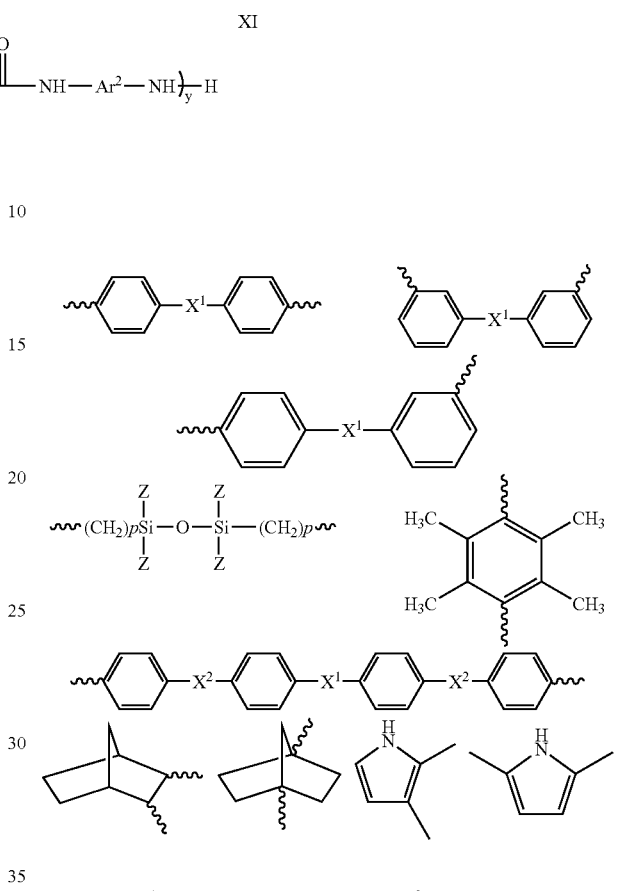

wherein $X^1$ is as defined before, $X^2$ is —O—, —S—, —C(CF$_3$)$_2$—, —CH$_2$—, —SO$_2$—, or —NHCO—, Z=H or $C_1$–$C_8$ linear, branched or cyclic alkyl and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl and cyclooctyl.

Examples of monomers having the Structure VIII containing $Ar^2$ include, but are not limited to, 5(6)-amino-1-(4-aminophenyl)-1,3,3-trimethylindane (DAPI), m-phenylenediamine, p-phenylenediamine, 2,2'-bis(trifluoromethyl)4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy) benzene, 1,3-bis(3-amino-phenoxy) benzene, 1,4-bis (γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12- diaminooctadecane, 2,17-diaminoeicosane, 3,3'-dimethyl-4, 4'-diaminodiphenylmethane, bis(4-aminocyclohexyl) methane, bis(3-aminonorbornyl)methane, 3,3'-diaminodiphenylethane, 4,4'-diaminodiphenylethane, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thiodianiline, 4,4'-thio-bis-(2-methylaniline), 4,4'-thio-bis-(2-methyoxyaniline), 4,4'-thio-bis-(2-chloroaniline), 3,3'-sulfonyl-dianiline, and 3,3'-sulfonyl-dianiline. Furthermore, the polybenzoxazole precursor base polymer X, may be synthesized using a mixture of two or more monomers described by generic Structure VIII.

In Structure IX, $Ar^3$ is a divalent aromatic, a divalent aliphatic, or a divalent heterocyclic group. Examples of $Ar^3$ include but are not limited to:

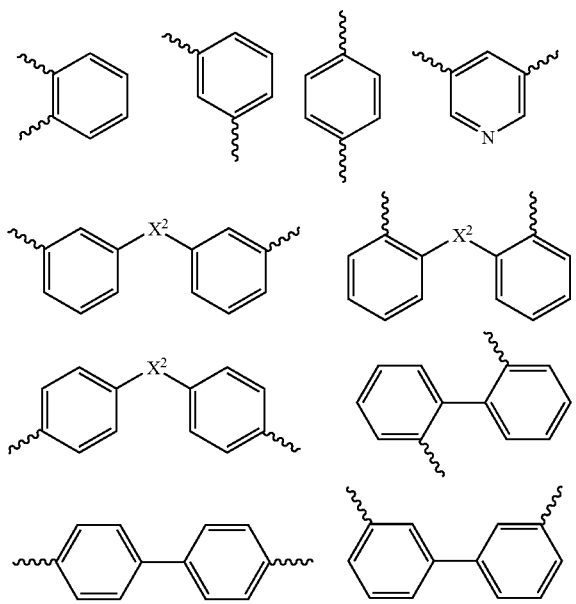

wherein $X^2$ is —O—, —S—, —C(CF$_3$)$_2$—, —CH$_2$—, —SO$_2$—, or —NHCO—.

In Structure IX, W is C(O)Cl, COOH or C(O)R$^8$ wherein R$^8$ is $C_1$–$C_7$ linear or branched alkyl group or a $C_5$–$C_8$ cycloalkyl group. Examples of R$^8$ include, but are not limited to, CH$_3$, C$_2$H$_5$, n-C$_3$H$_7$, i-C$_3$H$_7$, n-C$_4$H$_9$, t-C$_4$H$_9$, and cyclohexyl.

Monomers having the Structure IX are diacids, diacid dichlorides and diesters. Examples of suitable dicarboxylic acids (W═COOH) include, but are not limited to, 4,4'-diphenyletherdicarboxylic acid, terephthalic acid, isophthalic acid and mixtures thereof. Examples of suitable diacid chlorides (W═COCl) include, but are not limited to, isophthaloyl dichloride, phthaloyl dichloride, terephthaloyl dichloride, 4,4'-diphenyletherdicarboxylic acid dichloride, and mixtures thereof. Examples of suitable dicarboxylic esters (W═CO$_2$R$^8$) include, but are not limited to: dimethylisophthalate, dimethylphthalate, dimethylterephthalate, diethylisophthalate, diethylphthalate, diethylterephthalate and mixtures thereof.

In the first synthetic step monomers having Structures VII and VIII and IX can react to produce polybenzoxazole precursor base polymer X. Any conventional method for reacting a dicarboxylic acid or its dichloride or diester with at least one aromatic and/or heterocyclic dihydroxydiamine, and optionally, with at least one diamine, may be used. Generally, the reaction for diacids (W═C(O)Cl) is carried out at about −10° C. to about 30° C. for about 6 to about 48 hours in the presence of an approximately stoichiometric amount of amine base. Examples of suitable amine bases include, but are not limited to pyridine, triethyl amine, 1,8-diazabicyclo[5.4.0]undec-7-ene (DBU), 1,5-diazabicyclo[4.3.0]non-5-ene (DBN), dimethylpyridine, and dimethylaniline. The polybenzoxazole precursor base polymer X may be isolated by precipitation into water, recovered by filtration and dried. Descriptions of suitable syntheses employing diesters or diacids may be found in U.S. Pat. No. 4,395,482, U.S. Pat. No. 4,622,285, and U.S. Pat. No. 5,096,999, herein incorporated by reference.

The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having structure VII, VIII, and IX are employed such that the ratio of [VII+VIII]/IX is generally from about 1 to about 1.2. Preferably, the ratio of [VII+VIII]/IX is generally from about 1 to about 1.1. The monomer having the Structure VII is employed from about 10 to about 100 mole % of [VII+VIII] and the monomer having Structure VIII is employed from about 0 to about 90 mole % of [VII+VIII]. Distribution of the polymeric units resulting from monomers having the Structures VII and VIII in the polybenzoxazole precursor base polymer (enclosed in brackets in Structures I, III, X and XI) may be random or in blocks within it.

In Structures I, III, X and XI, x is an integer from about 10 to about 1000, y is an integer from about 0 to about 900 and (x+y) is about less then 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5.

The amount of (x+y) can be calculated by dividing the numeric average molecular weight (Mn) of a polymer of Structures I or III by the average molecular weight of the repeat unit. The value of Mn can be determined by such standard methods as membrane osmometry or gel permeation chromatography as described, for example, in Jan Rabek, Experimental Methods in Polymer Chemistry, John Wiley&Sons, New York, 1983.

It should be noted that molecular weight and inherent viscosity of the polymers and therefore, x and y at a constant stoichiometry, can have a wide range depend on the reaction conditions such as the purity of the solvent, the humidity, presence or absence of a blanket of nitrogen or argon gas, reaction temperature, reaction time, and other variables.

In the second synthesis step, polybenzoxazole base polymer X is reacted with G—M to produce the polybenzoxazole precursor polymer III where G is an organic group having a carbonyl, carbonyloxy or sulfonyl group attached directly to M and M is a reactive leaving group. Examples of G include, but are not limited to the following structures:

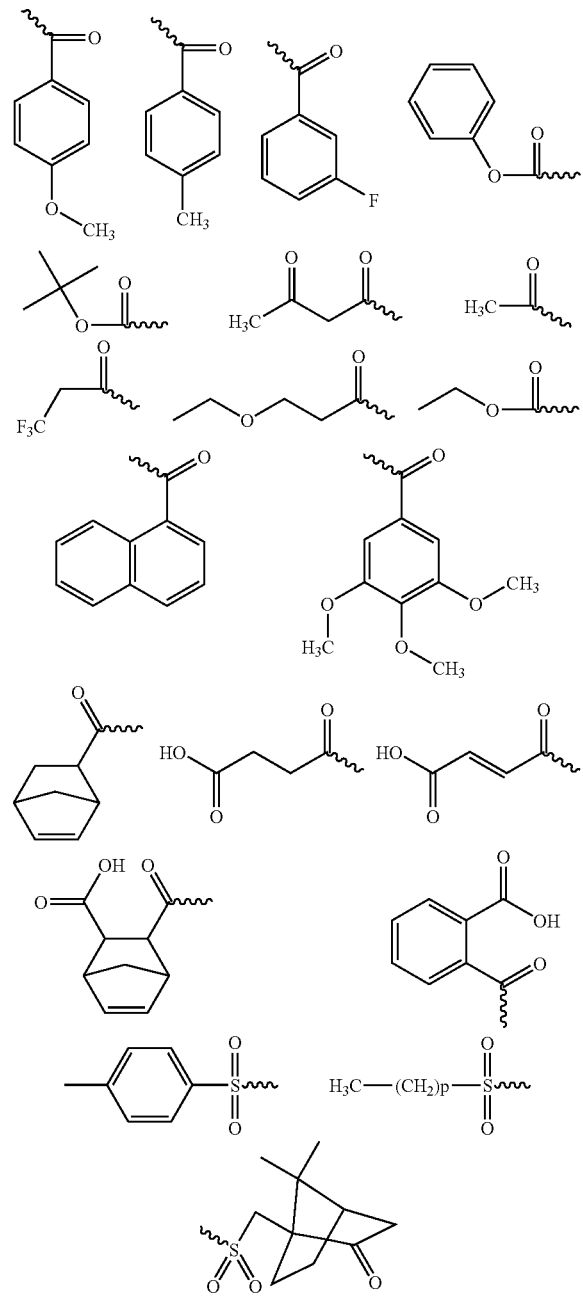

Examples of M groups include, but are not limited to, Cl, Br, mesylate, triflate, substituted carbonyloxy groups, and substituted carbonate groups.

Examples of suitable classes of G—M compounds includes but are not limited to carboxylic acid and sulfonic acid chlorides, carboxylic acid and sulfonic acid bromides, linear and cyclic carboxylic acid and sulfonic acid anhydrides, and alkoxy or aryloxy substituted acid chlorides. Examples of suitable G—M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyldicarbonate, dibutyidicarbonate, t-butyl chloroformate, ethyl chloroformate, n-butyl chloroformate, and methyl chloroformate. Further examples include compounds having the structures shown below. Preferred G are those obtained by reaction of the terminal $NH_2$ group of the polymer with an alkyl carboxylic acid chloride, a linear carboxylic acid anhydride (either one yielding G=alkylcarbonyl) or a cyclic anhydride.

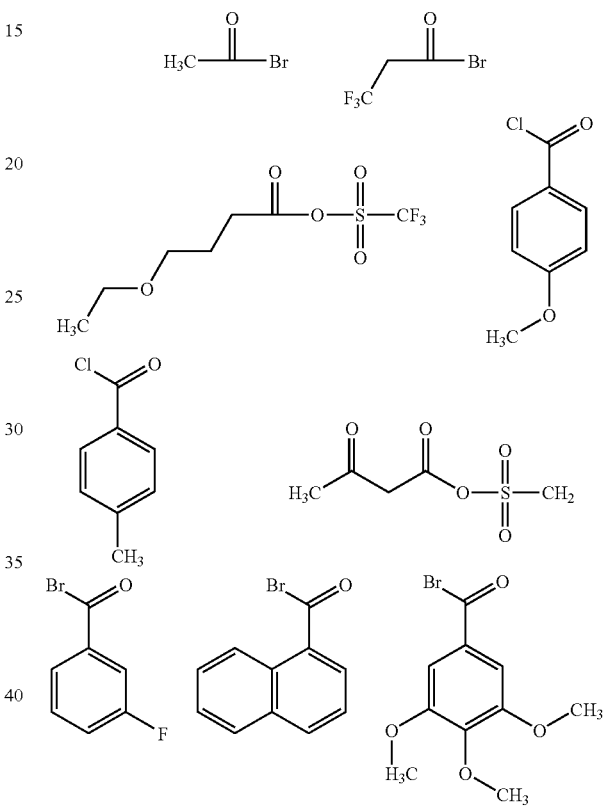

The reaction can be carried out in a suitable solvent by addition of G—M to a dry solution of the polybenzoxazole precursor base polymer at a temperature from about −25° C. to about 40° C. The more preferred temperature is from about 0° C. to about 25° C. The most preferred temperature is from about 5° C. to about 10° C. The reaction time is from about 1 hour to about 24 hours. The molar amount of GM employed is a slightly excess (3–6%) of the sum of the molar amounts of monomer of structures VII and VIII less the molar amount of monomer of structure IX. Addition of organic or inorganic base may also be employed. Examples of suitable organic amine bases include, but are not limited to pyridine, triethyl amine, 1,8-diazabicyclo[5.4.0]undec-7-ene (DBU), 1,5-diazabicyclo[4.3.0]non-5-ene (DBN), dimethylpyridine, and dimethylaniline. Examples of other suitable bases include sodium hydroxide, sodium carbonate, and sodium silicate.

The preferred reaction solvents are propyleneglycolmethylether acetate (PGMEA), N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

In the third reaction step, the polybenzoxazole precursor polymer III is reacted with about 1% to about 50% mole % (based on the number of OH groups from the monomer of Structure VII) of a diazoquinone compound DCI in the presence of a base to yield the polybenzoxazole precursor polymer I according to reaction 1.

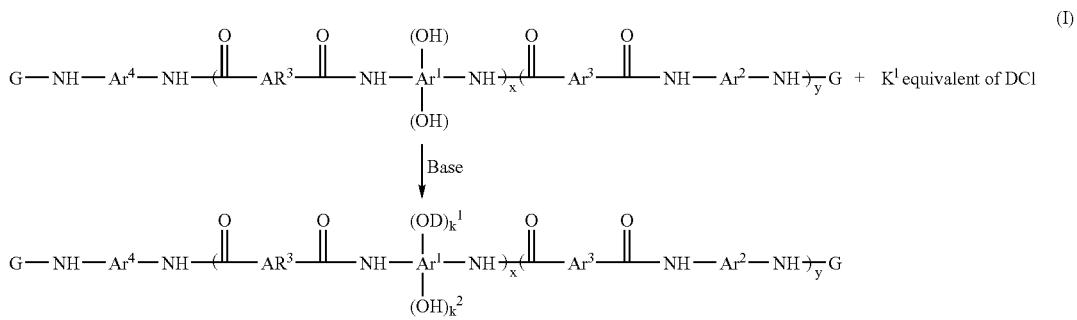

Reaction 1 wherein $Ar^1$, $Ar^2$, $Ar^3$, $Ar^4$, D, $k^1$, $k^2$, x, y, and G are as previously defined.

Examples of the diazoquinone compound DCI that can be reacted with the polybenzoxazole precursor polymer III (as well as polybenzoxazole precursor base polymer X) include but are not limited to one of the following diazoquinone-sulfonyl chlorides XIIa–XIIe:

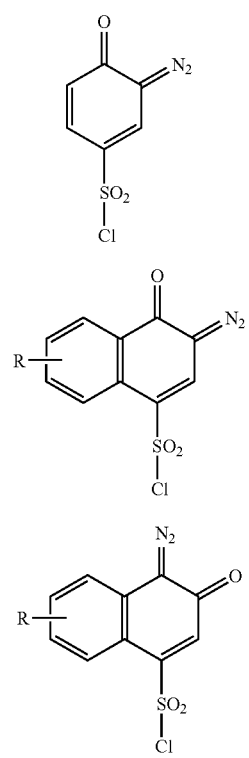

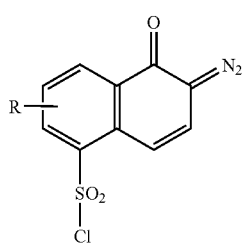

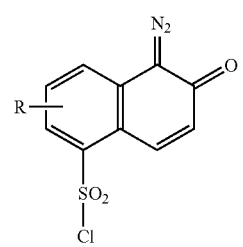

wherein R is H, a $C_1$–$C_4$ alkyl group, a $C_1$–$C_4$ alkoxy group, or cyclohexyl. Examples of suitable R groups include, but are nor limited to, methyl, ethyl, propyl, isopropyl, n-butyl, sec-butyl, t-butyl, cyclohexyl, methoxy, ethoxy, or n-butoxy.

Generally, the reaction is carried out at about 0° C. to about 30° C. for about 3 to about 24 hours in a solvent in the presence of a base. Generally, a slight excess of base to DCI is employed. Examples of bases include but are not limited to amine bases such as pyridine, trialkylamine, methylpyridine, lutidine, n-methylmorpholine, and the like. The most preferred base is triethylamine. The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, tetrahydrofuran, and diglyme. The most preferred solvents are tetrahydrofuran and gamma-butyrolactone (GBL). The reaction mixture should be protected from actinic rays.

The molar amount of DCI may range from about 1% to about 50% of the quantity of OH groups from monomers of Structure VII to yield $k^1$ from 0.01 to about 0.5. A preferred amount of DCI is from about 1% to about 40% of the quantity of OH groups from monomers of Structure VII to produce $k^1$ from about 0.01 to about 0.40. A more preferred amount of DCI is from about 1% to about 10% of the quantity of OH groups from monomers of Structure VII to produce $k^1$ from about 0.01 to about 0.10. A most preferred amount of DCI is from about 1% to about 5% of the quantity of OH groups from monomers of Structure VII to produce $k^1$ from about 0.01 to about 0.05.

Preferred polybenzoxazole precursor polymers I are those in which D is a moiety IIb or moiety IId. These may be obtained, for example, from reaction of diazonaphthoquinone sulfonyl chlorides XIIb and XIId respectively. More preferred polybenzoxazole precursor polymers I are those in which D is moiety IIb (R=H) or moiety IId in which (R=H). Most preferred polybenzoxazole precursor polymers I are those in which D is moiety IId (R=H).

In a second embodiment, the present invention provides a positive photosensitive resin composition comprising:

(a) at least one polybenzoxazole precursor polymer having the structure I or III;

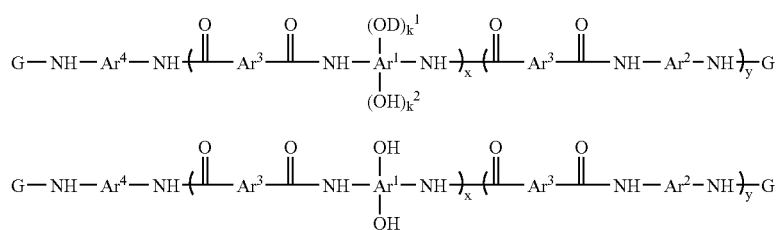

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon or mixtures thereof; $Ar^3$ is a divalent aromatic group, a divalent aliphatic group, a divalent heterocyclic group, or mixtures thereof; $Ar^4$ is $Ar^1(OH)_2$ or $Ar^2$; D is one of the moieties IIa–IIe as described previously; $k^1$ can be any positive value of up to about 0.5, $k^2$ can be any value from about 1.5 to 2 with the proviso that $(k^1+k^2)=2$, x is from about 10 to about 1000; y is from about 0 to about 900; and G is a monovalent organic group having a carbonyl, carbonyloxy or sulfonyl group, (b) at least one nonpolymeric photosensitive compound comprising a compound having within its structure one or more of moieties IIa–IIe, with the proviso that if III is the sole polybenzoxazole precursor polymer the nonpolymeric photosensitive compound is selected from the group consisting of compounds described by structures IV–VI,

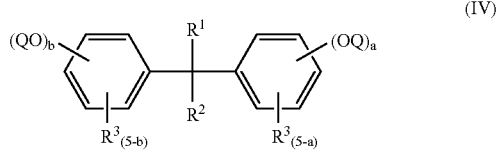

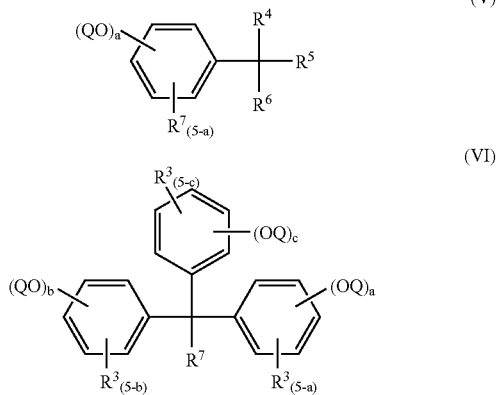

wherein $R^1$, $R^2$, $R^4$, $R^5$, $R^6$ and $R^7$ each independently are a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group or alternatively $R^1$ and $R^2$ or any two of $R^4$, $R^5$, and $R^6$ may together form a 5–7 membered ring; each $R^3$ is independently H, a linear or branched $C_1$–$C_4$ alkyl group, a phenyl or halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group or a phenyl or alkyl or halide substituted phenyl group; Q is H or D with the proviso that at least one Q=D; D is as defined hereinbefore; a is an integer from 1 to 5; b and c are integers from 0 to 5 with the provisos (1) that for Structure IV, if a=b=1 and both OQ are substituted para to the $R^1R^2C$ substituent, then both $R^1$ and $R^2$ are not simultaneously methyl and (2) $1<=a+b<6$; and the proviso that for Structure VI, if a=b=c=1 and all OQ are para to the triphenyl methane carbon substituent, then at least one $R^3$ is not H; and (c) at least one solvent.

The photosensitive composition comprises at least one nonpolymeric photosensitive compound comprising one or more diazoquinone moieties IIa–IIe. Non-polymeric compounds having diazoquinone moieties are typically diazoquinone esters of phenolic compounds or amides of aromatic amines. Examples of suitable non-polymeric diazoquinone compounds include, but are not limited to, one or more of the following compounds:

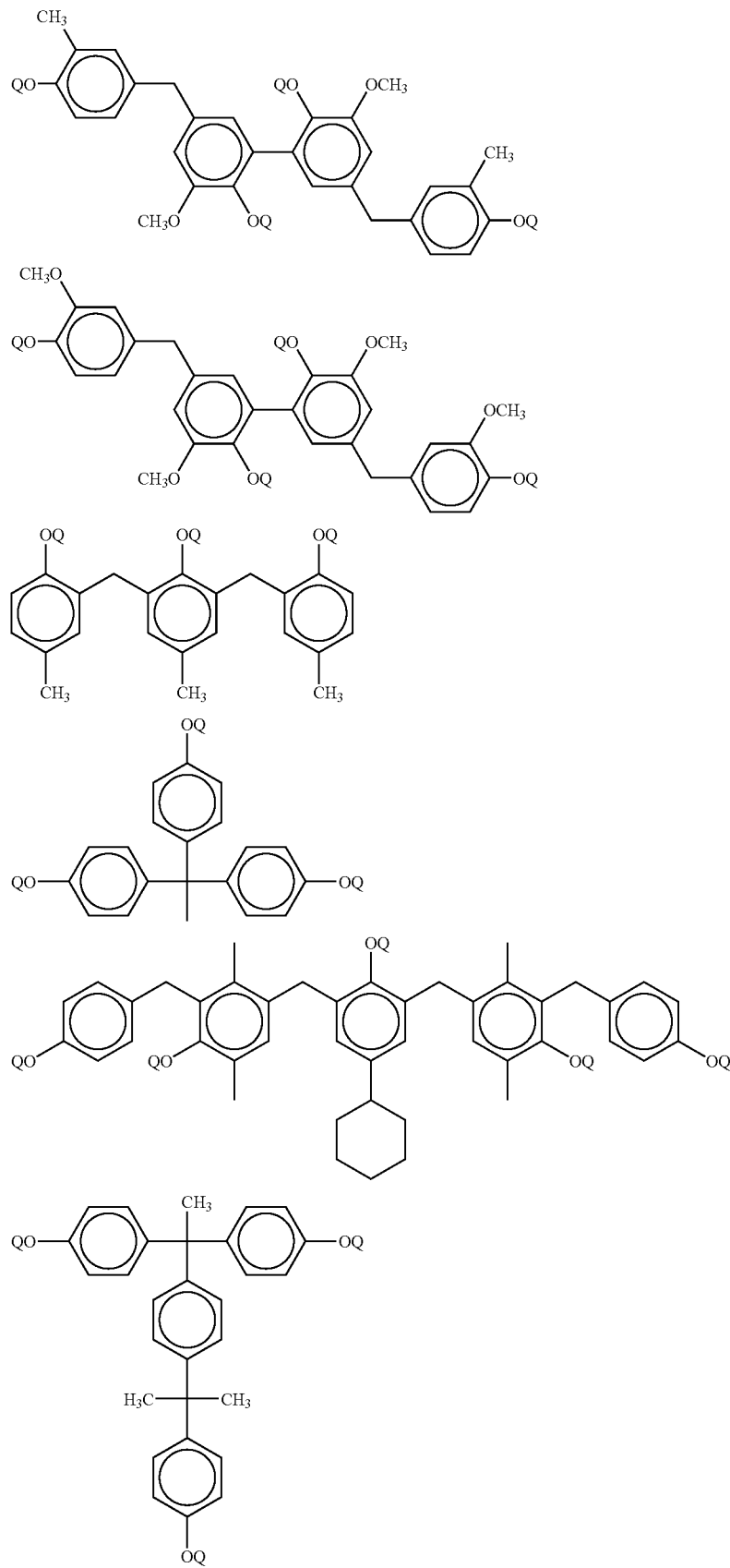

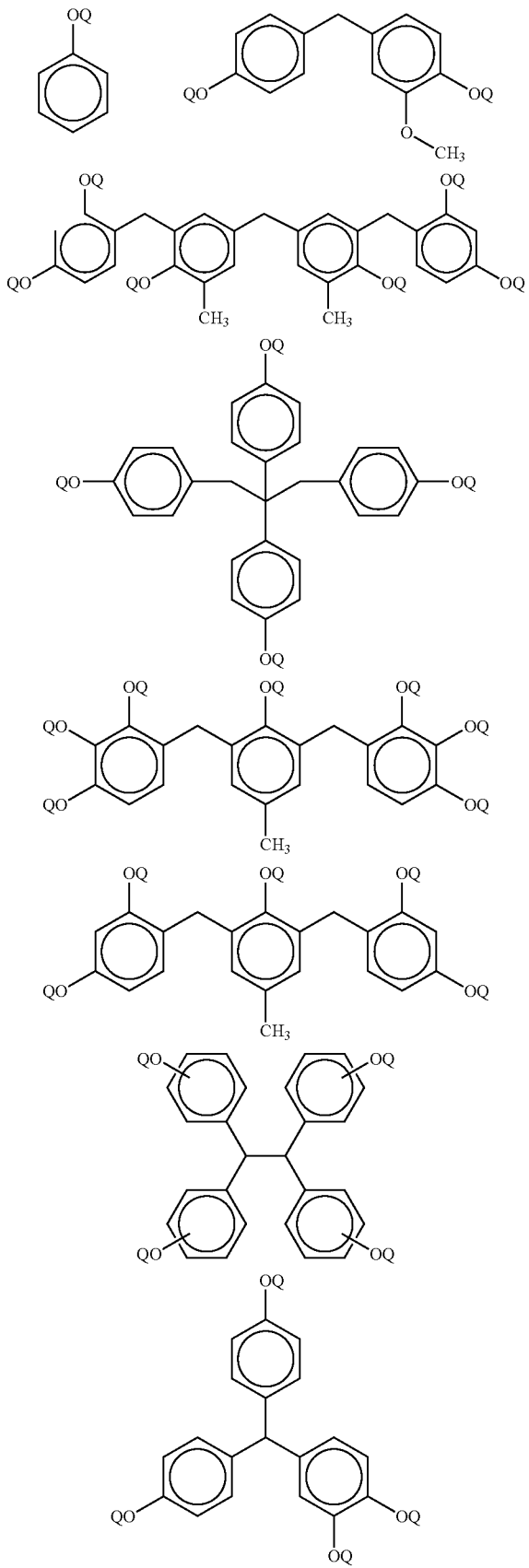

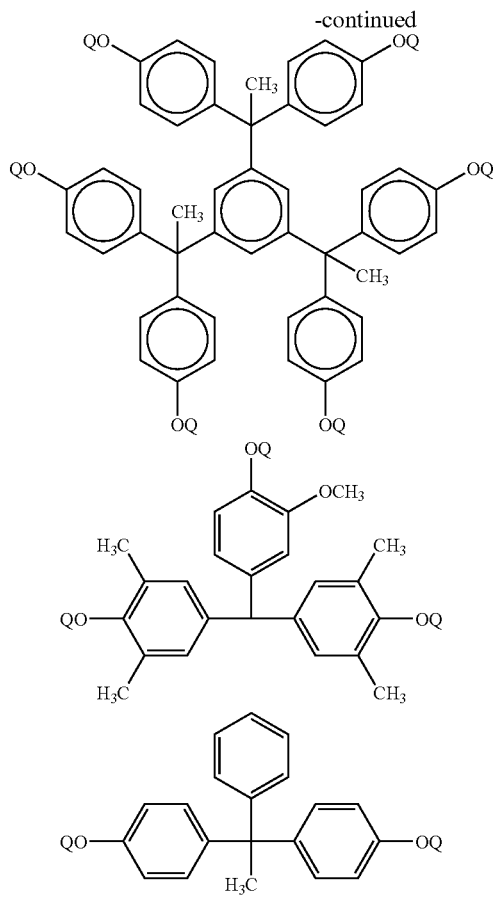

wherein each Q is independently H or D and each D is independently one of IIa–IIe with the proviso that in each compound at least one Q is not H.

It is also object of this invention to provide photosensitive compositions capable of curing to high temperature resistant features, which will not substantially darken during typical cure conditions. We have surprisingly found that positive polybenzoxazole precursor photosensitive formulations containing diazoquinone photoactive compounds which lack benzylic hydrogens on the photoactive compound backbone yield cured films significantly lighter in color. While not wishing to be bound by this explanation, it is believed that the reactivity of benzylic hydrogens may be influenced by the presence of substituents such as hydroxyl or sulfonyl groups typically found in diazoquinone photoactive compounds during the high temperature cures and lead to darkening.

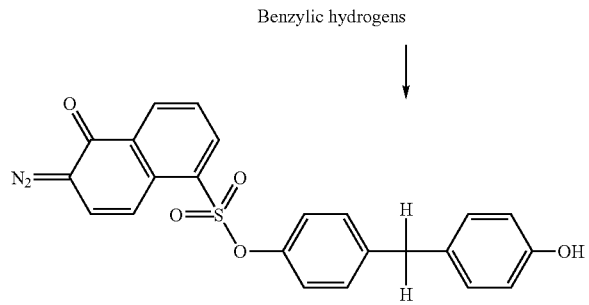

Therefore, preferred photosensitive compounds are those of Structures IV, V, and VI as shown previously. In Structures IV, V, and VI, examples of suitable $R^1$, $R^2$, $R^3$, $R^4$, $R^5$, $R^6$ and $R^7$ groups include, but are not limited to, methyl, ethyl, isopropyl, tert-butyl, 2-phenylpropyl, 1-methyl-1-phenylethyl, trifluoromethyl, trifluoroethyl, 3-chloropropyl, cyclopentyl, cyclohexyl, 2-methylcyclopentyl and 3-chlorocyclohexyl. Examples of $R^1$ and $R^2$ or any two of $R^4$, $R^5$, and $R^6$ forming a 5–7 membered ring include but are not limited to cyclopentylene and cyclohexylene. Additional suitable examples of $R^3$ include, but are not limited to, phenyl, biphenyl, 4-chlorophenyl, 2-ethyl phenyl, and 2,4,6-trimethyl phenyl.

More preferred photosensitive compounds are those of Structures IV, V, and VI in which D is moiety IIb or moiety IId. Most preferred photosensitive compounds are those of Structures IV, V, and VI in which D is moiety IIb (R=H) or moiety IId (R=H).

Preferred examples of compounds described by Structures IV, V, and VI include, but are not limited to:

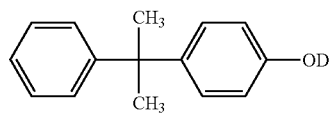

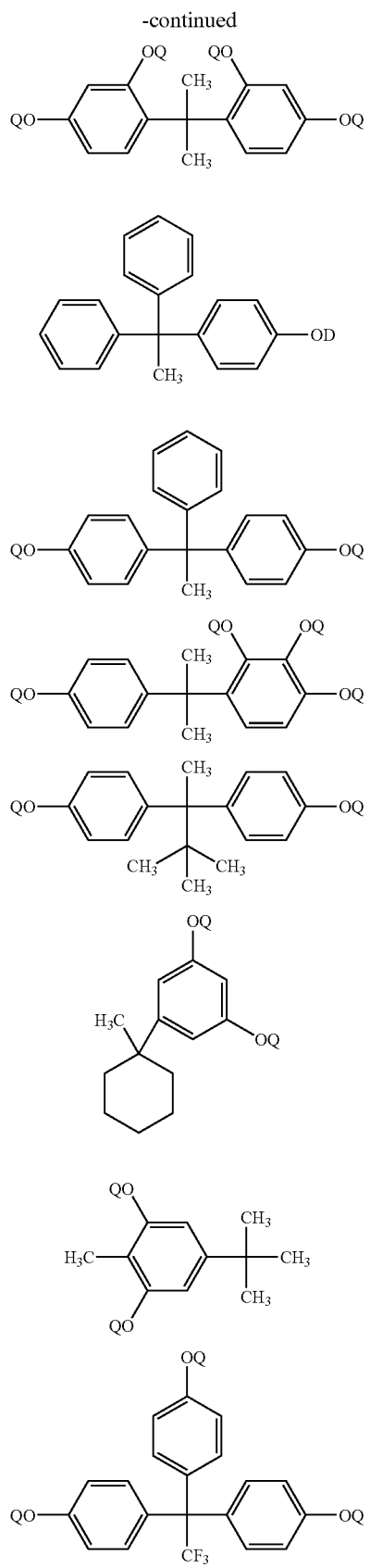
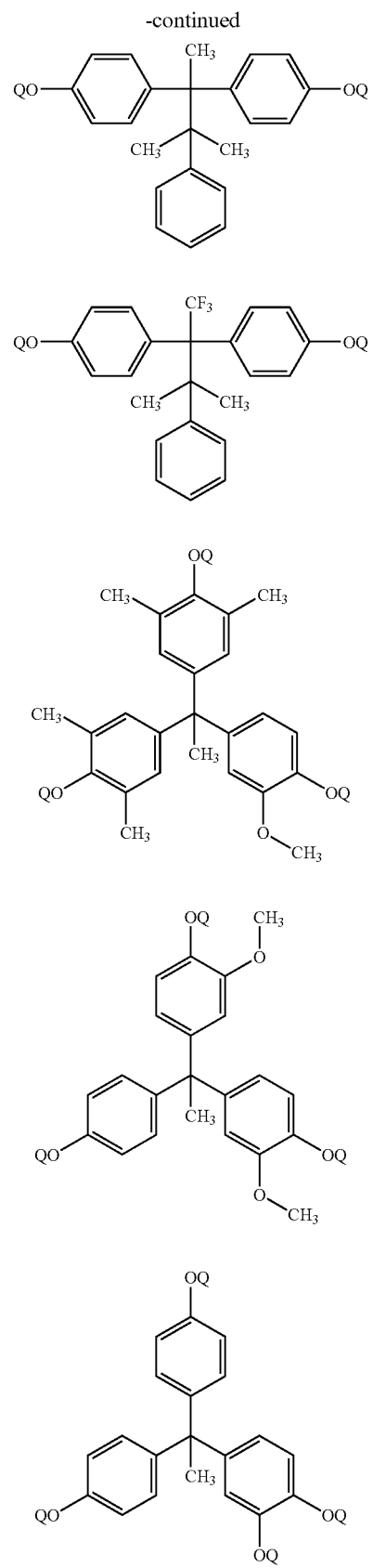

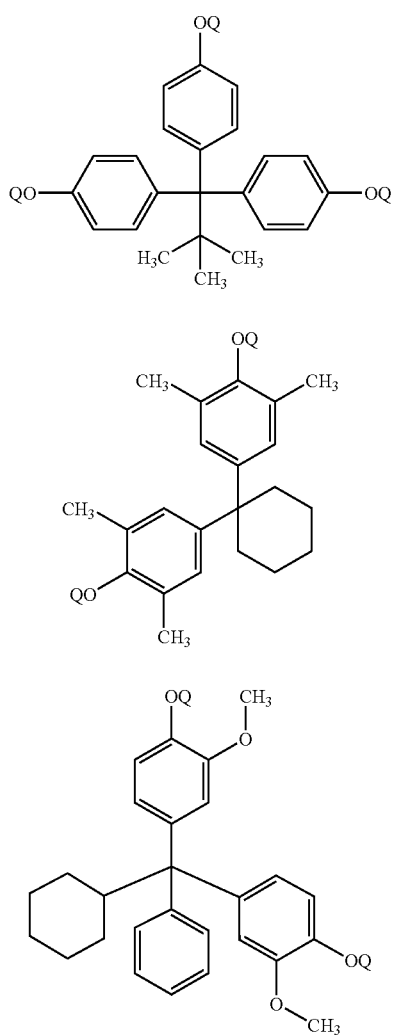

where the definition of Q and D are as previously described.

The phenolic compounds (i.e. the backbone) typically employed in the preparation of the photosensitive compound may be prepared by any suitable method. A common method of synthesis is by reaction of a suitable phenol derivative with a suitable aldehyde or ketone in the presence of a solvent such as methanol. The reaction is most often catalyzed by a strong acid (e.g. sulfuric acid or p-toluene sulfonic acid). Generally, the reaction is carried out at about 15° C. to about 80° C. for about 3 hours to about 48 hours.

The photoactive compounds are synthesized by reaction of the backbone with DCI. Generally, the reaction is carried out at about 0° C. to about 30° C. for about 4 to about 36 hours in a solvent in the presence of a base. Generally, a slight excess of base to DCI is employed. Examples of bases include but are not limited to amine bases such as pyridine, trialkylamine, methylpyridine, lutidine, n-methylmorpholine, and the like. The most preferred base is triethylamine. The preferred reaction solvents are tetrahydrofuran (THF), gamma-butyrolactone (GBL), N,N-dimethylformamide (DMF), acetone, N,N-dimethylacetamide (DMAc), dimethyl-2-piperidone, dimethylsulfoxide (DMSO), sulfolane, and diglyme. The most preferred solvents are tetrahydrofuran (THF), acetone and gamma-butyrolactone (GBL). The reaction mixture should be protected from actinic rays.

The molar amount of DCI may range from about 25% to about 100% of the quantity of OH groups in the backbone of photoactive compound. A preferred amount of DCI is from about 40% to about 98% of the quantity of OH groups in the backbone of photoactive compound. A more preferred amount of DCI is from about 50% to about 98% of the quantity of OH groups in the backbone of photoactive compound.

The positive acting, photosensitive composition of this invention further comprises at least one solvent. Suitable solvents include, but are not limited to, organic solvents, such as N-methylpyrrolidone (NMP), gamma-butyrolactone (GBL), N,N-dimethylacetamide (DMAc), dimethyl-2-piperidone, N,N-dimethylformamide (DMF), and mixtures thereof. The preferred solvents are gamma-butyrolactone and N-methylpyrrolidone. The most preferred solvent is gamma-butyrolactone.

The positive photosensitive resin composition of this invention comprises at least one polybenzoxazole precursor polymer of Structure I or III at from about 5 wt. % to about 50 wt. % of the total composition. A more preferred amount of polybenzoxazole precursors I or III is from about 10 wt % to about 45 wt %. A more preferred amount of polybenzoxazole precursors I or III is from about 15 wt % to about 43 wt %. The most preferred amount of polybenzoxazole precursors I or III is from about 20 wt % to about 40 wt %.

The polybenzoxazole precursor polymers used in the photosensitive composition may comprise the polybenzoxazole precursor polymer described by Structure I, the polybenzoxazole precursor polymer described by Structure III, or mixtures thereof. Polymers described by Structures I and III can be blended in any ratio. Preferred photosensitive compositions comprise those employing a mixture of at least one polybenzoxazole precursor polymer described by Structure I with at least one polybenzoxazole precursor polymer described by Structure III or at least one polybenzoxazole precursor polymer described by Structure I. More preferred photosensitive compositions employ only at least one polybenzoxazole precursor polymer described by Structure I.

The amount of photosensitive compound used in the composition of this invention is from about 1 wt. % to about 20 wt. % of the total weight of the composition, preferably, about 2 wt. % to about 10 wt. %, and most preferably, about 3 wt. % to about 5 wt. %. The photosensitive compounds may be blended together in any suitable ratio.

Solvent comprises about 40 wt. % to about 80 wt. % of the photosensitive composition. A preferred solvent range is from about 45 wt. % to about 70 wt. %. A more preferred range of solvent is from about 50 wt. % to about 65 wt. %.

Optionally, an adhesion promoter may be included in the photosensitive composition. If employed, the amount of adhesion promoter ranges from about 0.1 wt. % to about 2 wt. %. A preferred amount of adhesion promoter is from about 0.2 wt. % to about 1.5 wt. %. A more preferred amount of adhesion promoter is from about 0.3 wt. % to about 1 wt. %. Suitable adhesion promoters include, for example, amino silanes, and mixtures or derivatives thereof. Examples of suitable adhesion promoters which may be employed in the invention may be described by Structure XIII

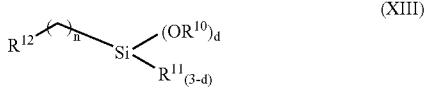

wherein each $R^{10}$ is independently a $C_1$–$C_4$ alkyl group or a $C_5$–$C_7$ cycloalkyl group and each $R^{11}$ is independently a $C_1$–$C_4$ alkyl group, a $C_1$–$C_4$ alkoxy group, a $C_5$–$C_7$ cycloalkyl group or a $C_5$–$C_7$ cycloalkoxy group; d is an integer from 0 to 3 and n is an integer from 1 to about 6. $R^{12}$ is one of the following moieties:

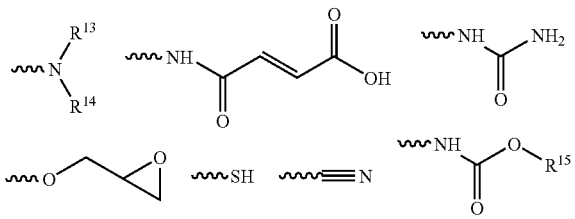

wherein each $R^{13}$ and $R^{14}$ are independently a $C_1$–$C_4$ alkyl group or a $C_5$–$C_7$ cycloalkyl group, and $R^{15}$ is a $C_1$–$C_4$ alkyl group and a $C_5$–$C_7$ cycloalkyl group. Preferred adhesion promoters are those wherein $R^{12}$ are

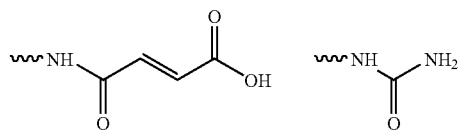

More preferred adhesion promoters are those wherein $R^{12}$ is

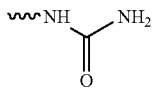

The most preferred adhesion promoters are

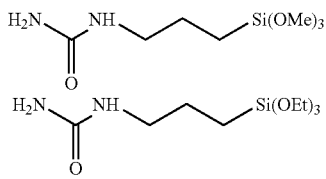

The photosensitive compositions of the present invention may further include other additives. Suitable additives include, for example, leveling agents, dissolution inhibitors and the like. Such additives may be included in the photosensitive compositions in about 0.1–10 wt % of the sum of the weights of photoactive agent and polybenzoxazole precursor polymers I and III.

Furthermore, the present invention concerns a process for forming a relief pattern using the photosensitive composition. The process comprises the steps of:

(a) coating on a suitable substrate, a positive-working photosensitive composition comprising at least one polybenzoxazole precursor polymers having the Structure I or III; at least one non-polymeric photosensitive compound comprising one or more of moieties IIa–IIe, with the proviso that if the polybenzoxazole precursor polymer III is the sole resin, then the non-polymeric photosensitive compound is selected from the group of compounds described by Structures IV, V or VI as described before; and at least one solvent, thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

To ensure proper adhesion of the photosensitive composition to the substrate the substrate may be optionally treated with an (external) adhesion promoter before the first coating step or the photosensitive composition may employ an internal adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed. Classes of suitable external adhesion promoters include but are not limited to vinylalkoxysilanes, methacryloxalkoxyysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are more preferred. Examples of suitable external adhesion promoters include, but are not limited to gamma-aminopropyltrimethoxy-silane, gamma-glycidoxypropylmethyldimethoxysilane, gamma-glycidoxypropyl-methyldiethoxysilane, gamma-mercaptopropylmethyldimethoxysilane, 3-methacryl-oxypropyldimethoxymethylsilane, and 3-methacryloxypropyltri-methoxysilane. gamma-Aminopropyltrimethoxysilane is more preferred. Additional suitable adhesion promoters are described in "Silane Coupling Agent" Edwin P. Plueddemann, 1982 Plenum Press, New York. The process may optionally include the step of post exposure baking the exposed coated substrate at an elevated temperature, prior to developing. Still another optional step is rinsing the developed substrate, prior to curing.

The positive acting, photoactive resin of this invention is coated on a suitable substrate. The substrate may be, for example, semiconductor materials such as a silicon wafer or a ceramic substrate, glass, metal, or plastic. Coating methods include, but are not limited to spray coating, spin coating, offset printing, roller coating, screen printing, extrusion coating, meniscus coating, curtain coating, and immersion coating.

The resulting film is prebaked at an elevated temperature. The bake may be completed at one or more temperatures within the temperature bake of from about 70° C. to about 120° C. for about several minutes to about half an hour, depending on the method, to evaporate the remaining solvent. Any suitable baking means may be employed.

Examples of suitable baking means include, but are not limited to, hot plates and convection ovens. The resulting dry film has a thickness of from about 3 to about 20 micron or more preferably from about 4 to about 15 micron or most preferably from about 5 to about 10 micron.

After the bake step, the resulting dry film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, in an optional step it may be advantageous to heat the exposed and coated substrate to a temperature between about 70° C. and 120° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g., diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddle, or other similar developing methods at temperatures from about 10° C. to 40° C. for about 30 seconds to about 5 minutes. After development, the relief pattern may be optionally rinsed using deionized water and dried by spinning, baking on a hot plate, in an oven, or other suitable means.

The benzoxazole ring is then formed by curing of the uncured relief pattern to obtain the final high heat resistant pattern. Curing is performed by baking the developed, uncured relief pattern at or above the glass transition temperature $T_g$ of the photosensitive composition to obtain the benzoxazole ring that provides high heat resistance. Typically, temperatures above about 200 C are used.

Formation of polybenzoxazole ring

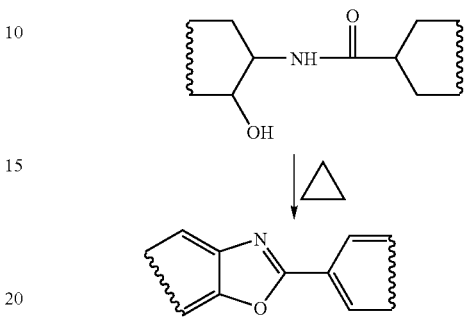

Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate or in a convection oven.

In addition, the present invention includes electronic parts obtained by using the invention composition.

To illustrate the present invention, the following examples are provided. It should be understood that the present invention is not limited to the examples described.

SYNTHESIS EXAMPLE 1

Synthesis of Polymer of Structure Xa

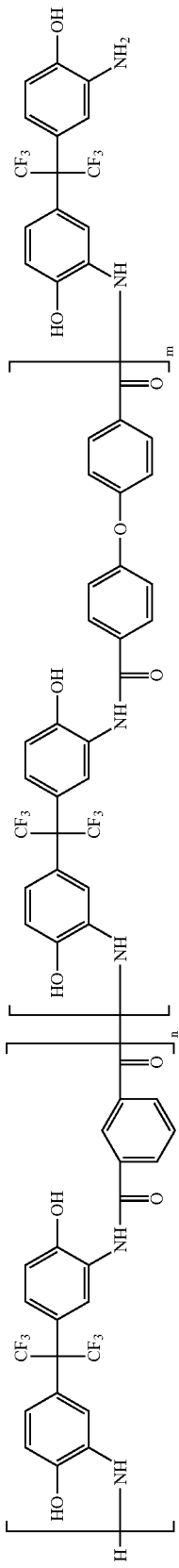

To a 100 mL three-necked round bottom flask equipped with a mechanical stirrer, nitrogen inlet and addition funnel, 3.66 g (10 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids dissolved and then cooled in an ice water bath at 0–5° C. To this solution, 1.01 g (5 mmol) of isophthaloyl chloride and 1.477 g (5 mmol) of 1,4-oxydibenzoyl chloride dissolved in 10 g of NMP were added drop-wise. After the addition was completed, the resulting mixture was stirred at room temperature for 18 hours. The viscous solution was precipitated in 800 mL of vigorously stirred de-ionized water. The polymer was collected by filtration and washed with de-ionized water and a water/methanol (50/50) mixture. The polymer was dried under vacuum at 105° C. for 24 hours. The yield was almost quantitative and the inherent viscosity of the polymer was 0.36 dL/g measured in NMP at the concentration of 0.5 g/dL at 25° C.

SYNTHESIS EXAMPLE 2

Synthesis of Polymer of Structure Xa having Alternate Monomer Ratios

Synthesis Example 1 was repeated except the ratio of diacid dichloride mixture reduced from 1:1 to 0.90:1. The yield was almost quantitative and the inherent viscosity (IV) of the polymer was 0.20 dL/g measured in NMP at a concentration of 0.5 g/dL at 25° C.

The number average molecular weight (Mn) was determined by gel permiation chromatography using four Phenogel 10 columns with pore sizes of $10^4$ A, 500 A, 100 A and 50 A and THF as an eluent. Polystyrene standards were used for calibration. The typical Mn for a polymer prepared by the above procedure was 5,800. The average molecular weight of the repeat unit is about 540, so the degree of polymerization (x+y) was determined to be about 11 (5800/540). Since y=0, X=11.

SYNTHESIS EXAMPLE 3

Synthesis of a Polymer of Structure IIIa

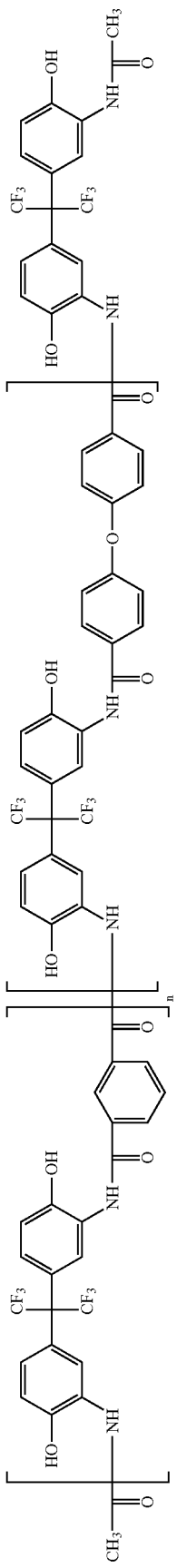

3 small batches of polybenzoxazole precursor polymers synthesized according to Synthesis Example 2 were mixed to obtain 100 g (184.5 mmol) of polybenzoxazole precursor polymer mixture with inherent viscosity of 0.205 dL/g. The mixture was dissolved in 1000 g of diglyme. Residual water was removed as an azeotrope with diglyme using a rotary evaporator at 65° C. (10–12 torr). About 500 g of solvents was removed during the azeotropic distillation.

The reaction solution was transferred to a 1000 mL, three neck, round bottom flask equipped with N2 inlet and magnetic stirrer. The reaction mixture cooled with an ice bath down to about 5° C. Acetyl chloride (3.3 ml, 3.6 g) was added via syringe over a 5 minute period while stirring the reaction mixture. The reaction mixture was continually cooled by the ice bath for about 10 minutes following the completion of the addition of the acetyl chloride. Then the ice bath was removed and the reaction was allowed to warm up over the period of 1 hr. Then, the mixture was again cooled to 5° C. on the ice bath. Pyridine (3.7 ml, 3.6 g) was added via syringe over the period of 1 hr. Reaction was kept on the ice bath for 10 min, and then was allowed to warm up over the period of 1 hr.

The reaction mixture was precipitated into 6 L of water. The polymer was collected by filtration and air dried overnight. Then, the polymer was dissolved in 500–600 g of acetone and precipitated into 6 L of water/methanol (70/30). The polymer was again collected by filtration and air-dried for several hours. The wet polymer cake was dissolved in a mixture 700 g of THF and was precipitated in 7 L of water, filtered, air-dried overnight followed by 24 hr drying in vacuum oven at 90° C.

Terminal NH$_2$ groups have a $^1$H nmr chemical shift of 4.5 ppm. After the reaction of acetyl chloride and polybenzoxazole precursor polymer was completed, it was observed that this peak was completely vanished, indicative that all NH$_2$ groups were reacted.

To a 1 L three-necked round bottom flask equipped with a mechanical stirrer, 67.5 g (approximately 120 mmol) of a mixture of two batches of polymer synthesized according to Synthesis Example 3 and 650 g of tetrahydrofuran (THF) were added. The mixture was stirred for ten minutes and the solid was fully dissolved. 1.01 g (0.38 mmole) of 2,1-naphthoquinonediazide-5-sulfonyl chloride (IId R═H) was then added and the mixture was stirred for another 10 minutes. Triethylamine, 0.39 g (3.9 mmol) mixed with 50 mL THF was added gradually within 30 minutes and then the reaction mixture was stirred for overnight. The reaction mixture was then added gradually to 3 L of vigorously stirred de-ionized water. The precipitated product was separated by filtration and reslurried twice, each time with 3 L of de-ionized water. After filtration the product was washed with 2 L de-ionized water. The isolated product was dried at 40° C. overnight. The yield of product was 84%.

SYNTHESIS EXAMPLE 4

Synthesis of a Polymer of Structure Ia

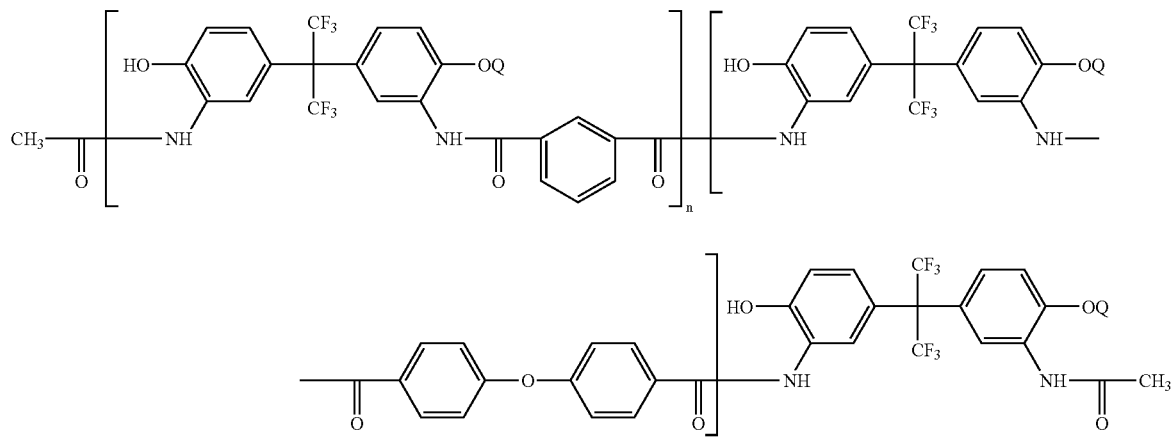

SYNTHESIS EXAMPLE 5

Synthesis of a Polymer of Structure I Via an Alternative Embodiment (Step 2) using Polymer of Structure XIa as Intermediate

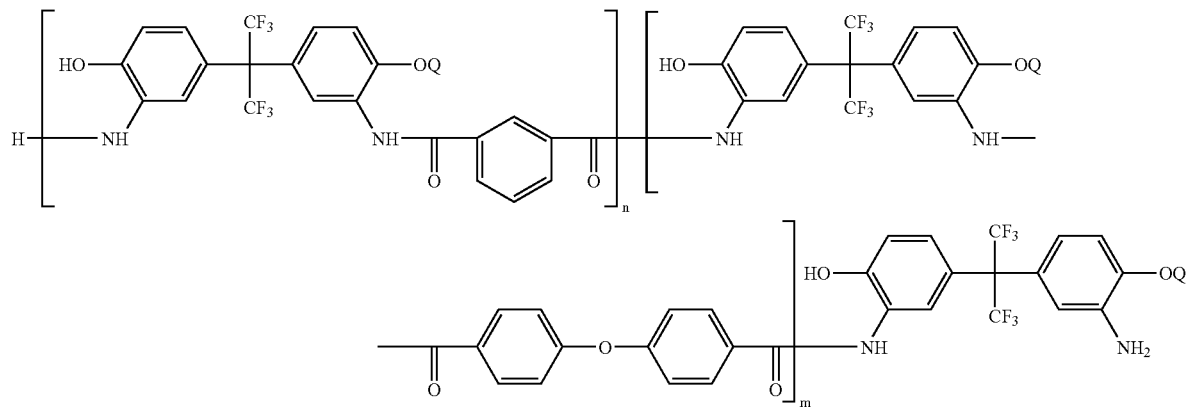

To a 100 mL three-necked round bottom flask equipped with a mechanical stirrer, 5.42 g (10.0 mmol) of the polymer obtained in Synthesis Example 1 and 50 mL of tetrahydrofuran (THF) were added. The mixture was stirred for ten minutes and the solid was fully dissolved. 0.53 g (2 mmole) of 2,1-naphthoquinonediazide-5-sulfonyl chloride (IId R=H) was then added and the mixture was stirred for another 10 minutes. Triethylamine, 0.2 g (2 mmol), was added gradually within 15 minutes and then the reaction mixture was stirred for 5 hours. The reaction mixture was then added gradually to 500 mL of vigorously stirred de-ionized water. The precipitated product was separated by filtration and washed with 200 mL of de-ionized water. To the product was added another 600 mL de-ionized water and the mixture vigorously stirred for 30 minutes. After filtration the product was washed with 100 mL de-ionized water. The isolated product was dried at 40° C. overnight. The yield was 91%.

SYNTHESIS EXAMPLE 6

Synthesis of a Polymer of Structure I Via an Alternative Embodiment (Step 2) using Polymer of Structure XIa Having Alternate Monomer Ratios Synthesis Example 5 was repeated except the polymer obtained in Synthesis Example 2 was reacted with 3 mole % of 2,1-naphthoquinonediazide-5-sulfonyl chloride (IId R=H). The inherent viscosity of the polymer was 0.20 dL/g measured in NMP at the concentration of 0.5 g/dL at 25° C.

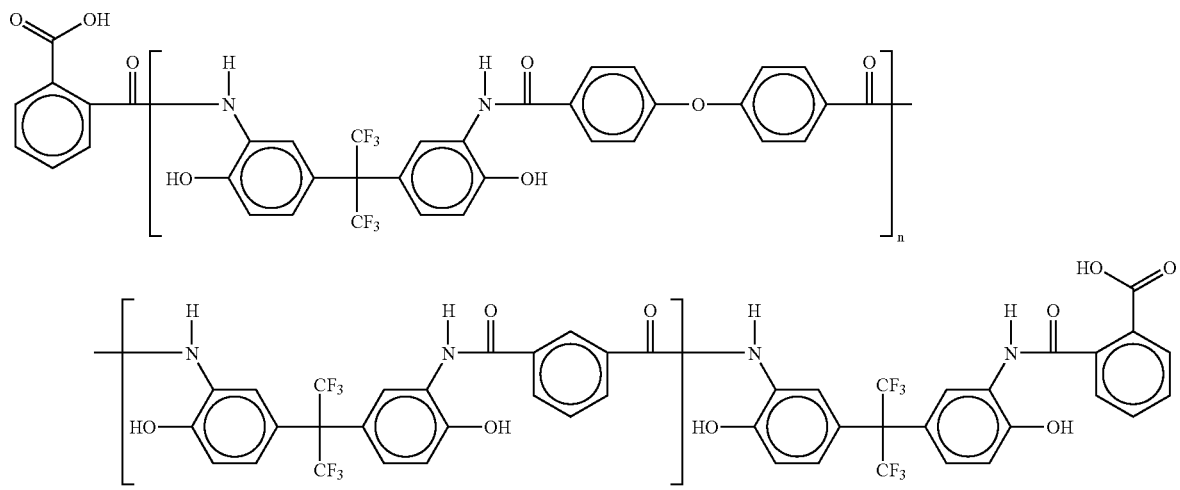

SYNTHESIS EXAMPLE 7

Synthesis of a Polymer of Structure Ib Via an Alternative Embodiment (Step 3)

To a 1 L three-necked round bottom flask equipped with a mechanical stirrer, and nitrogen inlet 100 g (165.9 mmol) of the polymer obtained in Synthesis Example 6 and 290 g of diglyme were added. The mixture was stirred for about 25 minutes and the solid was fully dissolved. 6.5 g (43.9 mmole) of phthalic anhydride was then added portion-wise within an hour at room temperature and the mixture was stirred for 16 hours. The reaction mixture was then added gradually to 5200 mL of vigorously stirred de-ionized water during a 60 minutes period. The precipitated product was separated by filtration and washed with 2000 mL of de-ionized water. To the product was added another 4000 mL de-ionized water and the mixture vigorously stirred for 30 minutes. After filtration the product was washed with 2000 mL de-ionized water. The isolated product was dried at 40° C. overnight. The yield of product was 90%.

SYNTHESIS EXAMPLE 8

Preparation of Polybenzoxazole Precursor polymer of Structure Xc

To a 20 L reactor equipped with a mechanical agitator, nitrogen inlet and thermocouple, 1500 g (4.09 mol) of hexafluoro-2,2-bis(3-amino-4-hydroxyphenyl)propane, 622 g (7.86 mol) of pyridine and 7250 g of N-methyl-2-pyrrolidone (NMP) were added. The solution was stirred at room temperature until all solids dissolved and then cooled in an ice water bath at 0–5° C. To this solution, 291 g g (1.43 mol) of terephthaloyl chloride and 634.5 g (2.15 mol) of 1,4-oxydibenzoyl chloride dissolved in 2760 g of NMP was added by using a diaphragm pump and Teflon transfer lines. The pump and Teflon transfer lines were cleaned by using 200 g of NMP. After the addition was completed, the resulting mixture was stirred at room temperature for 18 hours. The viscous solution was precipitated in 140 L of vigorously stirred de-ionized water. The polymer was collected by filtration and washed with 35 L of de-ionized water and a water/methanol (50/50) mixture. The polymer was dried under vacuum at 75° C. for 24 hours. The yield was almost quantitative and the inherent viscosity of the polymer was 0.183 dL/g measured in NMP at the concentration of 0.5 g/dL at 25° C.

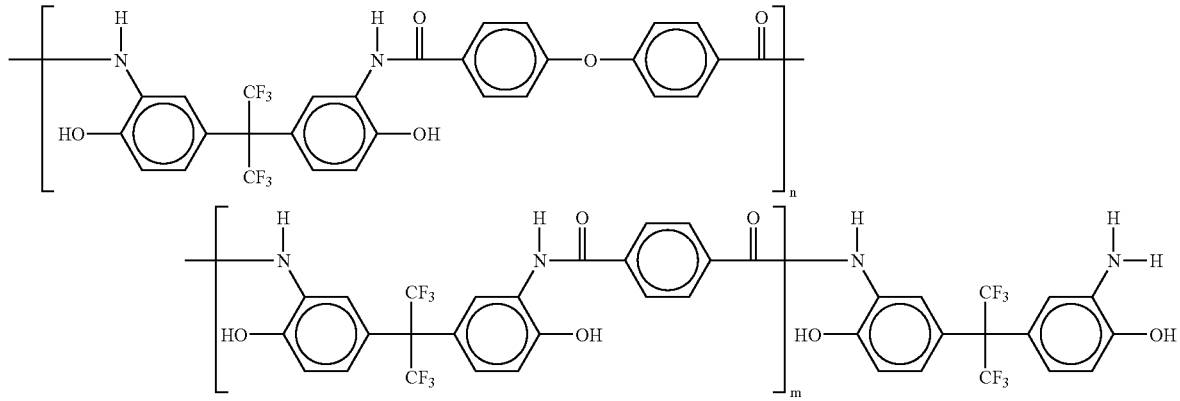

45

SYNTHESIS EXAMPLE 9

Synthesis of Polymer of Structure (IIIc)

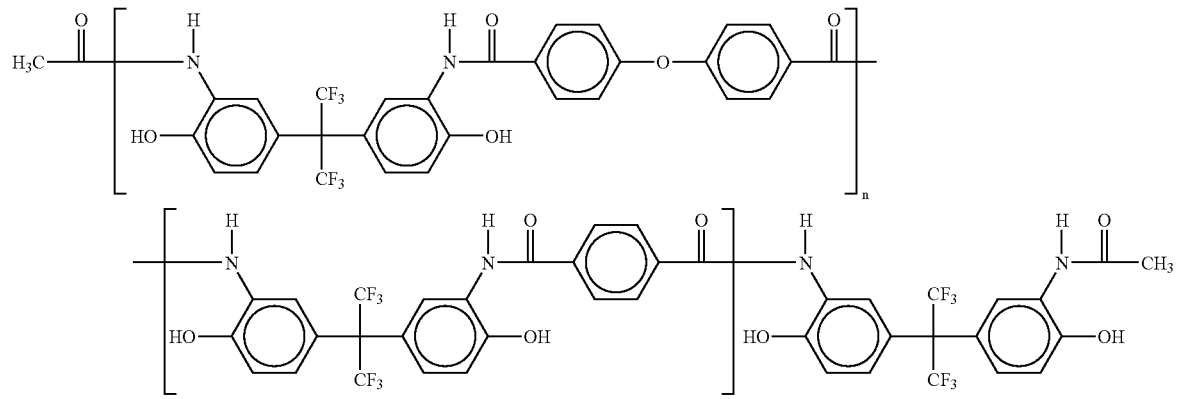

Synthesis Example 3 was repeated except the polymer employed was the one prepared in Synthesis Example 8. The yield was 83.7% and the inherent viscosity of the polymer was 0.205 dL/g measured in NMP at the concentration of 0.5 g/dL at 25° C.

SYNTHESIS EXAMPLE 10

Synthesis of Polymer of Structure (Ic)

To a 20 L reactor equipped with a mechanical agitator, nitrogen inlet and thermocouple, 1500 g (4.09 mol) of hexafluoro-2,2-bis(3-amino-4-hydroxyphenyl)propane, 622 g (7.86 mol) of pyridine and 5000 g of N-methyl-2-pyrrolidone (NMP) were added. The solution was stirred at room temperature until all solids dissolved and then cooled in an ice water bath at 0–5° C. To this solution, 212.0 g g (1.04 mol) of terephthaloyl chloride, 212.0 g g (1.04 mol) of isophthaloyl chloride and 411.0 g (1.39 mol) of 1,4-oxydibenzoyl chloride dissolved in 2960 g of NMP was added

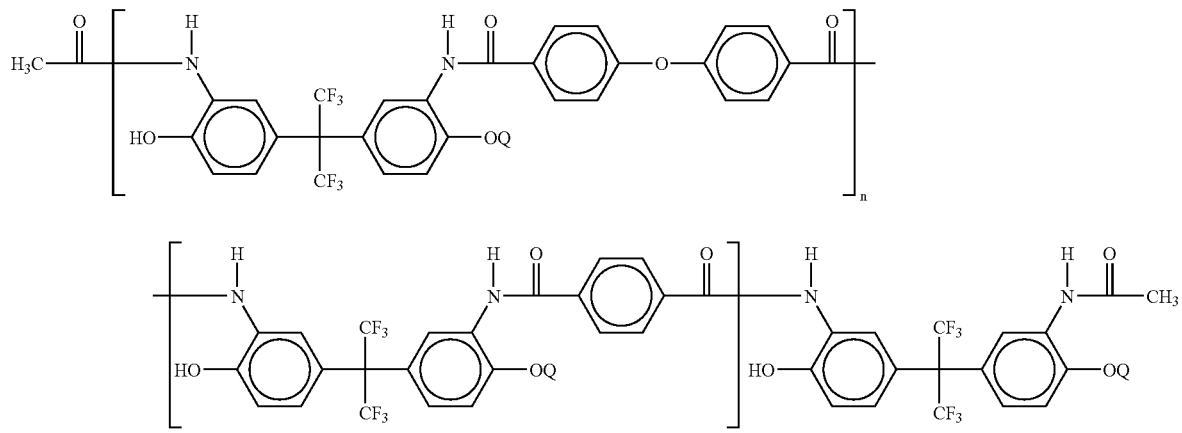

Synthesis Example 4 was repeated except the polymer used was one synthesized in Synthesis Example 9 and the ratio of 2,1-naphthoquinonediazide-5-sulfonyl chloride (IId R=H) to OH groups of the polymer was changed to 2.0/100. The yield was 96% and the inherent viscosity of the polymer was 0.204 dL/g measured in NMP at the concentration of 0.5 g/dL at 25° C.

SYNTHESIS EXAMPLE 11

Preparation of Polybenzoxazole Precursor Polymer of Structure Xd by using a diaphragm pump and Teflon transfer lines. The pump and Teflon transfer lines were cleaned by using 200 g of NMP and the rinse added to the reaction mixture. After the addition was completed, the resulting mixture was stirred at room temperature for 18 hours. The viscous solution was precipitated in 140 L of vigorously stirred de-ionized water. The polymer was collected by filtration and washed with 35 L of de-ionized water and a water/methanol (50/50) mixture. The polymer was dried under vacuum at 75° C. for 24 hours. The yield was almost quantitative and the inherent viscosity of the polymer was 0.205 dL/g measured in NMP at the concentration of 0.5 g/dL at 25° C.

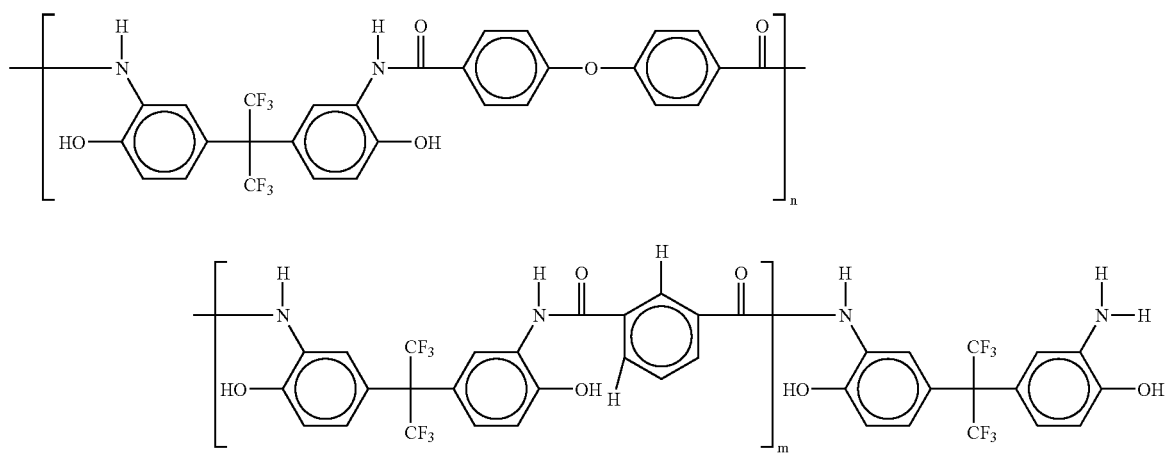

SYNTHESIS EXAMPLE 12

Synthesis of Polymer of Structure (IIId)

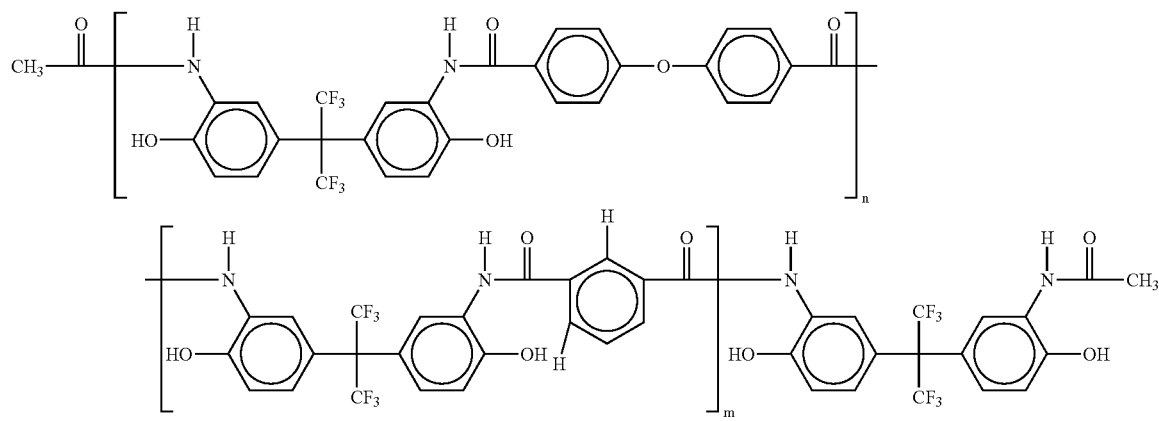

Synthesis Example 3 was repeated except the polymer used was one prepared in Synthesis Example 11. The yield was 93.6% and the inherent viscosity of the polymer was 0.212 dL/g measured in NMP at the concentration of 0.5 g/dL at 25° C.

SYNTHESIS EXAMPLE 13

Synthesis of Polymer of Structure (Id)

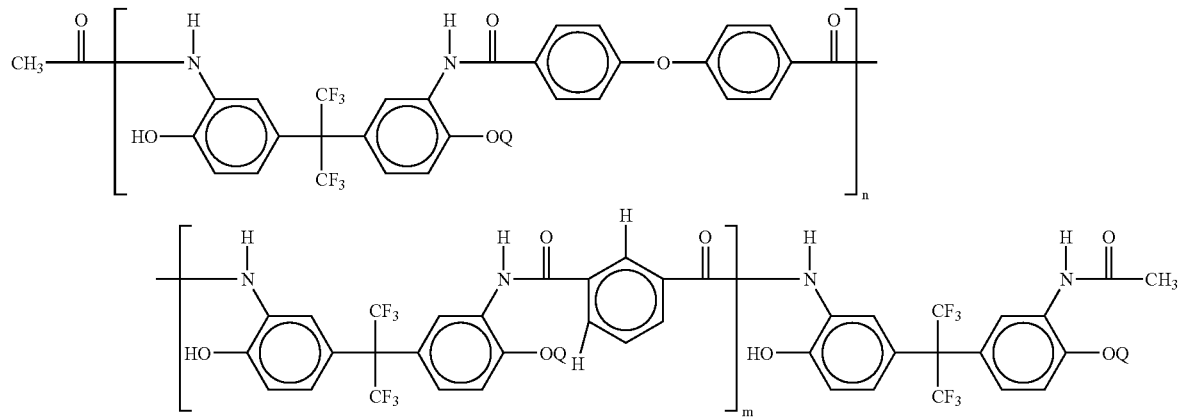

Synthesis Example 4 was repeated except the polymer employed was the one prepared in Synthesis Example 12 and the ratio of 2,1-naphthoquinonediazide-5-sulfonyl chloride (IId R=H) to OH groups of the polymer was changed to 3.0/100. The yield was 98.7% and the inherent viscosity of the polymer was 0.206 dL/g measured in NMP at the concentration of 0.5 g/dL at 25° C.

EXAMPLE 1

Solution Viscosity Stability Study of a Photosensitive Composition having Polymer of Structure Ia 100 parts of polymer obtained in Synthesis Example 4, 11.9 parts of Bisphenol AP PAC, 5 parts of diphenylsilane diol and 3 parts of gamma-isocyanatopropyltriethoxysilane were dissolved in GBL and filtered. The kinematic viscosity changes at 33° C. were followed for 14 days and the results are shown in Table 1.

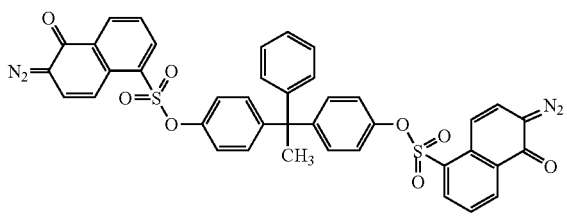

Bis phenol AP PAC

TABLE 1

Kinematic viscosity increase using current invention

| Time (Days) | Kinematic viscosity (cSt) | Kinematic viscosity change (%) |
|---|---|---|
| 0 | 1635 | 0 |
| 3 | 1929 | 17.98 |
| 6 | 1965 | 20.18 |
| 10 | 1974 | 20.73 |
| 14 | 2069 | 26.54 |

COMPARATIVE EXAMPLE 1

Solution Viscosity Stability Study of a Photosensitive Composition having Polymer of Structure XI A mixture of 100 parts polymer obtained in Synthesis Example 6, 11.9 parts of Bisphenol AP PAC, 5 parts of diphenylsilanediol and 3 parts of gamma-isocyanatopropyltriethoxysilane were dissolved in GBL and filtered. The kinematic viscosity changes at 33° C. were followed for 14 days and the results are shown in Table 2.

TABLE 2

Kinematic viscosity increase using known art

| Time (Days) | Kinematic viscosity (cSt) | Kinematic viscosity change (%) |
|---|---|---|
| 0 | 1116 | 0 |
| 2 | 1291 | 15.68 |
| 6 | 1540 | 37.99 |
| 9 | 1777 | 59.23 |
| 12 | 2032 | 82.08 |
| 14 | 2216 | 98.57 |

Comparative Example 1 and Example 1 show that the stability of the polybenzoxazole precursor polymer having both an endcap and a diazoquinone moiety is superior to that of having a diazoquinone moiety but no end cap.

FORMULATION EXAMPLE 1

The following positive acting photosensitive composition was prepared: 100 parts of polymer obtained in Synthesis Example 2, 11.9 parts of Bisphenol AP PAC, 5 parts of diphenylsilane diol were dissolved in GBL and filtered.

COMPARATIVE FORMULATION EXAMPLE 1

A positive acting photosensitive composition was prepared by dissolving 100 parts of polymer obtained in Synthesis Example 2, 11.9 parts of PAC having the structure below, where 20% of Q is H and the remainder is the diazoquinone moiety shown below (IId; R=H), and 5 parts of diphenylsilanediol in GBL and filtered.

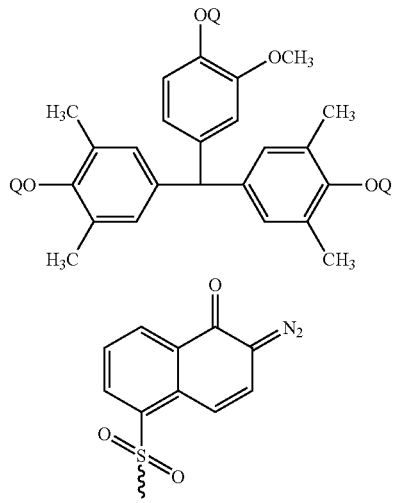

EXAMPLE 2

3 ml samples of the photosensitive formulations prepared in Formulation Examples 1 and Comparative Formulation Example 1 were spin coated at 1000 revolutions per minute onto a glass slide and then baked on a hotplate for 3 minutes at 120° C. to yield a film of 2.95 μm. The wafers were then cured in a vacuum oven under a $N_2$ purge. The oven cure program started at 100° C. and increased at a rate of 5 degrees/min up to 350° C. The cure was held at 350° C. for 1 hour and was cooled down to 100° C. over 2 hours. The cured films were then examined for darkening. The cured film from Formulation Example 1 was darkened significantly less than the film from Comparative Formulation Example 1.

LITHOGRAPHIC EXAMPLE 1

Lithographic Evaluation of a Photosensitive Composition Based on a Polymer with Structure Ia 100 parts of polymer obtained in Synthesis Example 3, 11.9 parts of Bisphenol AP PAC, 5 parts of diphenylsilanediol and 3 parts of gamma-isocyanatopropyltriethoxysilane were dissolved in GBL and filtered. The formulation was spin coated on a silicon wafer and then baked on a hotplate for 3 minutes at 115° C., resulting in a film thickness of 12.87 μm. The film was then exposed utilizing an i-line stepper in an open frame exposure array, which incrementally increased exposure energy 20 mJ/cm² with a starting exposure energy of 150 mJ/cm². The wafer was then spun at 500 rpm and spray developed with a 0.262N aqueous solution of tetramethyl ammonium hydroxide, resulting in a array of exposed boxes that were either clear of or containing residual photosensitive composition. These boxes were visually inspected for what was exposure energy at which residual photosensitive composition was completely cleared from the exposed area. The composition cleared boxes at a dose of 290 mJ/cm². The unexposed film thickness decreased 39% to 7.87 microns.

LITHOGRAPHIC EXAMPLE 2

100 parts of polymer obtained in Synthesis Example 10, 9 parts of Bisphenol AP PAC, 3.0 parts of gamma-mercaptopropyltrimethoxysilane and 3 parts of diphenylsilanediol were dissolved in NMP and filtered.

The formulation was spin coated at 1300 revolutions per minute on a silicon wafer and then baked on a hotplate for 4 minutes at 120° C., resulting in a film thickness of 13.96 μm as measured by a profilometer. The film was then exposed utilizing an i-line stepper in an open frame exposure array, which incrementally increased exposure energy 50 mJ/cm$^2$ with a starting exposure energy of 500 mJ/cm$^2$. The wafer was then developed with two 7 second puddles with a 0.262N aqueous solution of tetramethyl ammonium hydroxide, resulting in an array of exposed boxes that were either clear of or containing residual photosensitive composition. These boxes were visually inspected for what was exposure energy at which residual photosensitive composition was completely cleared from the exposed area. The composition cleared boxes at a dose of 1150 mJ/cm$^2$. The unexposed film thickness decreased to 7.43 microns.

LITHOGRAPHIC EXAMPLE 3

100 parts of polymer obtained in Synthesis Example 13, 10 parts of the photosensitive compound shown below (Q=50% H and 50% moiety IId) and 2.0 parts of gamma-glycidoxypropyltrimethoxysilane were dissolved in NMP and filtered.

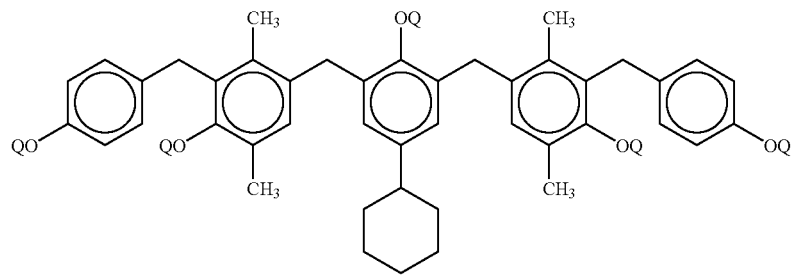

The formulation was spin coated at 900 revolutions per minute on a silicon wafer and then baked on a hotplate for 4 minutes at 120° C., resulting in a film thickness of 12.17 μm as measured by a profilometer. The film was then exposed utilizing an i-line stepper in an open frame exposure array, which incrementally increased exposure energy 20 mJ/cm$^2$ with a starting exposure energy of 100 mJ/cm$^2$. The wafer was then developed with two 6 second puddles with a 0.262N aqueous solution of tetramethyl ammonium hydroxide, resulting in a array of exposed boxes that were either clear of or containing residual photosensitive composition. These boxes were visually inspected for what was exposure energy at which residual photosensitive composition was completely cleared from the exposed area. The composition cleared boxes at a dose of 460 mJ/cm$^2$. The unexposed film thickness decreased to 5.25 microns.

LITHOGRAPHIC EXAMPLE 4

100 parts of polymer obtained in Synthesis Example 3, 13.5 parts of Bisphenol AP PAC, 2.0 parts of gamma-ureidopropyltrimethoxysilane and 2.5 parts of diphenylsilanediol were dissolved in GBL and filtered. The formulation was spin coated at 950 revolutions per minute on a silicon wafer and then baked on a hotplate for 4 minutes at 120° C., resulting in a film thickness of 14.04 μm as measured by a profilometer. The film was then exposed utilizing an i-line stepper in an open frame exposure array, which incrementally increased exposure energy 20 mJ/cm$^2$ with a starting exposure energy of 900 mJ/cm$^2$. The wafer was then developed with two 30 second puddles with a 0.262N aqueous solution of tetramethyl ammonium hydroxide, resulting in a array of exposed boxes that were either clear of or containing residual photosensitive composition. These boxes were visually inspected for what was exposure energy at which residual photosensitive composition was completely cleared from the exposed area. The composition cleared boxes at a dose of 1020 mJ/cm$^2$. The unexposed film thickness decreased to 11.18 microns.

LITHOGRAPHIC EXAMPLE 5

100 parts of polymer obtained in Synthesis Example 3, 17 parts of the PAC used in Comparative Formulation Example 1, and 2.5 parts of gamma-ureidopropyltrimethoxysilane were dissolved in GBL and filtered. The formulation was spin coated at 1200 revolutions per minute on a silicon wafer and then baked on a hotplate for 4 minutes at 120° C., resulting in a film thickness of 13.91 μm as measured by a profilometer. The film was then exposed utilizing an i-line stepper in an open frame exposure array, which incrementally increased exposure energy 20 mJ/cm$^2$ with a starting exposure energy of 1000 mJ/cm$^2$. The wafer was then developed with two 30 second puddles with a 0.262N aqueous solution of tetramethyl ammonium hydroxide, resulting in an array of exposed boxes that were either clear of or containing residual photosensitive composition. These boxes were visually inspected for what was exposure energy at which residual photosensitive composition was completely cleared from the exposed area. The composition cleared boxes at a dose of 1160 mJ/cm$^2$. The unexposed film thickness decreased to 11.56 microns.

LITHOGRAPHIC EXAMPLE 6

The composition employed in Lithographic Example 5 was spin coated at 1200 revolutions per minute on a silicon wafer and then baked on a hotplate for 4 minutes at 120° C., resulting in a film thickness of 14.10 μm as measured by a profilometer. The film was then exposed utilizing an i-line stepper in an open frame exposure array, which incrementally increased exposure energy 20 mJ/cm$^2$ with a starting exposure energy of 700 mJ/cm$^2$. The wafer was then developed with two 40 second puddles with a 0.262N aqueous solution of tetramethyl ammonium hydroxide, resulting in an array of exposed boxes that were either clear of or containing residual photosensitive composition. These boxes were visually inspected for what was exposure energy at which residual photosensitive composition was completely cleared from the exposed area. The composition cleared boxes at a dose of 1050 mJ/cm². The unexposed film thickness decreased to 11.00 microns.

LITHOGRAPHIC EXAMPLE 7

The composition employed in Lithographic Example 5 was spin coated at 1200 revolutions per minute on a silicon wafer and then baked on a hotplate for 4 minutes at 120° C., resulting in a film thickness of 14.18 μm as measured by a profilometer. The film was then exposed utilizing an i-line stepper in an open frame exposure array, which incrementally increased exposure energy 20 mJ/cm² with a starting exposure energy of 500 mJ/cm². The wafer was then developed with two 60 second puddles with a 0.262N aqueous solution of tetramethyl ammonium hydroxide, resulting in an array of exposed boxes that were either clear of or containing residual photosensitive composition. These boxes were visually inspected for what was exposure energy at which residual photosensitive composition was completely cleared from the exposed area. The composition cleared boxes at a dose of 810 mJ/cm². The unexposed film thickness decreased to 9.16 microns.

LITHOGRAPHIC EXAMPLE 8

The composition employed in Lithographic Example 5 was spin coated at 1200 revolutions per minute on a silicon wafer and then baked on a hotplate for 4 minutes at 120° C., resulting in a film thickness of 14.23 μm as measured by a profilometer. The film was then exposed utilizing an i-line stepper in an open frame exposure array, which incrementally increased exposure energy 20 mJ/cm² with a starting exposure energy of 300 mJ/cm². The wafer was then developed with two 80 second puddles with a 0.262N aqueous solution of tetramethyl ammonium hydroxide, resulting in an array of exposed boxes that were either clear of or containing residual photosensitive composition. These boxes were visually inspected for what was exposure energy at which residual photosensitive composition was completely cleared from the exposed area. The composition cleared boxes at a dose of 620 mJ/cm². The unexposed film thickness decreased to 8.26 microns.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:
1. A polybenzoxazole precursor polymer with Structure I

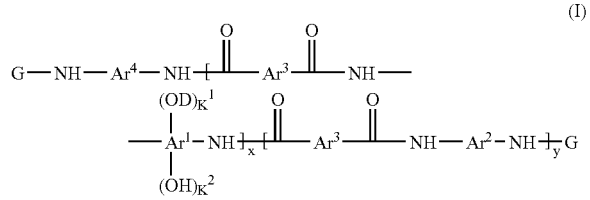

wherein $Ar^1$ is selected from the group consisting of a tetravalent aromatic group, a tetravalent heterocyclic group and mixtures thereof; $Ar^2$ is selected from the group consisting of a divalent aromatic, a divalent heterocyclic, a divalent alicyclic and a divalent aliphatic group that may contain silicon; $Ar^3$ is selected from the group consisting of a divalent aromatic group, a divalent aliphatic group, a divalent heterocyclic group and mixtures thereof; $Ar^4$ is selected from the group consisting of $Ar^1$ $(OH)_2$ and $Ar^2$, x is from about 10 to about 1000; y is from 0 to about 900; D is selected from the group consisting of one of the following moieties IIa–IIe:

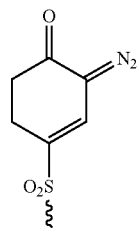

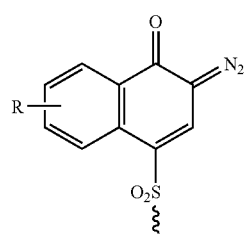

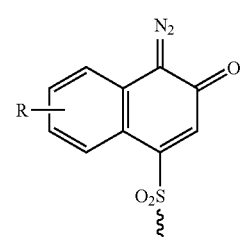

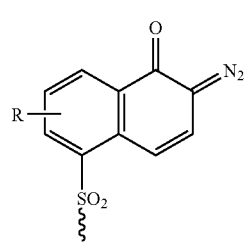

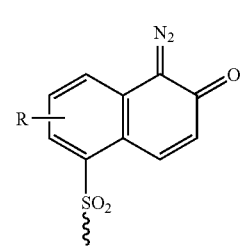

wherein, R is selected from the group consisting of H, a $C_1$–$C_4$ alkyl group, a $C_1$–$C_4$ alkoxy group and a cyclohexyl group, $k^1$ can be any positive value of up to about 0.5, $k^2$ can be any value from about 1.5 to about 2 with the proviso that $(k^1+k^2)=2$, x is from about 10 to about 1000; y is from about 0 to about 900; G is an organic group having a carbonyl, carbonyloxy or sulfonyl group attached directly to the terminal NH of the polymer.

2. A polybenzoxazole precursor polymer according to claim 1, wherein $Ar^1$ is a moiety selected from the group consisting of

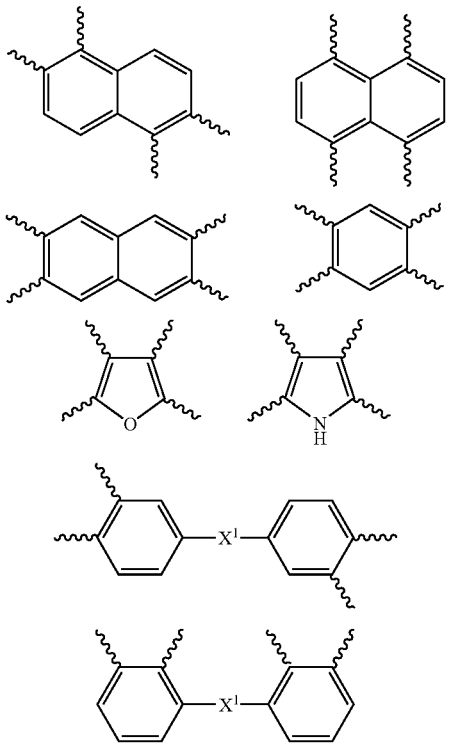

wherein $X^1$ is selected from the group consisting of —O—, —S—, —C(CF$_3$)$_2$—, —CH$_2$—, —SO$_2$—, —NHCO— and —SiR$^9{}_2$— and each $R^9$ is independently selected from the group consisting of a $C_1$–$C_7$ linear or branched alkyl and a $C_5$–$C_8$ cycloalkyl group.

3. A polybenzoxazole precursor polymer according to claim 1, wherein $Ar^1$ is a moiety derived from a reactant selected from the group consisting of 2,2-bis(3-amino-4-hydroxyphenyl)-hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane and mixtures thereof.

4. A polybenzoxazole precursor polymer according to claim 1, wherein $Ar^3$ is a moiety selected from the group consisting of

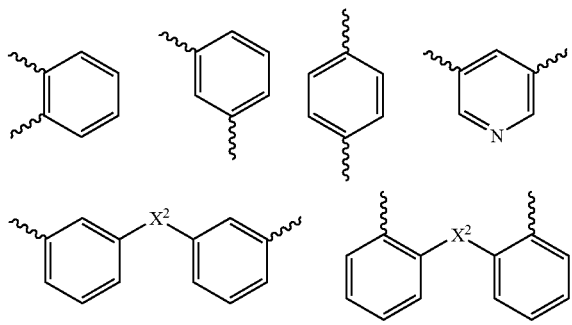

-continued

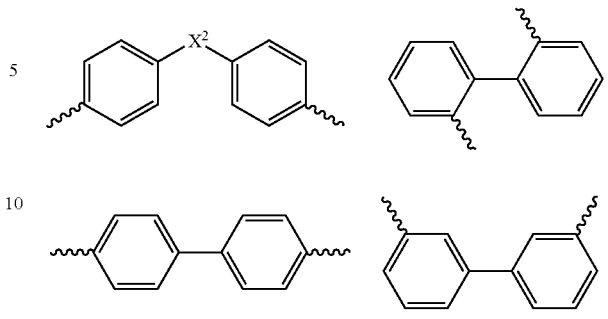

wherein $X^2$ is selected from the group consisting of —O—, —S—, —C(CF$_3$)$_2$—, —CH$_2$—, —SO$_2$—, and —NHCO—.

5. A polybenzoxazole precursor polymer according to claim 1, wherein $Ar^3$ is a moiety derived from a reactant selected from the group consisting of 4,4'-diphenyletherdicarboxylic acid, terephthalic acid, isophthalic acid, isophthaloyl dichloride, phthaloyl dichloride, terephthaloyl dichloride, 4,4'-diphenyletherdicarboxylic acid dichloride, dimethylisophthalate, dimethylphthalate, dimethylterephthalate, diethylisophthalate, diethylphthalate, diethylterephthalate and mixtures thereof.

6. A polybenzoxazole precursor polymer according to claim 1, wherein D is selected from the group consisting of the moiety IIb and the moiety IId.

7. A polybenzoxazole precursor polymer according to claim 1, wherein $k^1$ is from about 0.01 to about 0.1.

8. A polybenzoxazole precursor polymer according to claim 1, wherein G is an organic group having a carbonyl group attached directly to the terminal NH of the polybenzoxazole precursor polymer.

9. A polybenzoxazole precursor polymer according to claim 1, wherein G is alkylcarbonyl.

10. A polybenzoxazole precursor polymer according to claim 1, wherein $Ar^1$ is a moiety derived from a reactant selected from the group consisting of 2,2-bis(3-amino-4-hydroxyphenyl)-hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane or mixtures thereof, and D is selected from the group consisting of the moiety IIb and the moiety IId.

11. A polybenzoxazole precursor polymer according to claim 1, wherein $Ar^1$ is a moiety derived from a reactant selected from the group consisting of 2,2-bis(3-amino-4-hydroxyphenyl)-hexafluoropropane, 3,3'-dihydroxy-4,4'-diaminodiphenylether, 3,3'-dihydroxybenzidine, 4,6-diaminoresorcinol, and G is alkylcarbonyl.

12. A positive photosensitive resin composition comprising:
(a) at least one polybenzoxazole precursor polymer selected from the group consisting of polymers having Structure I and III;

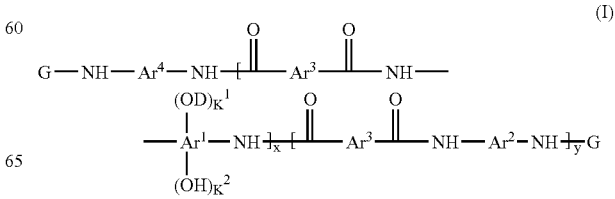

-continued

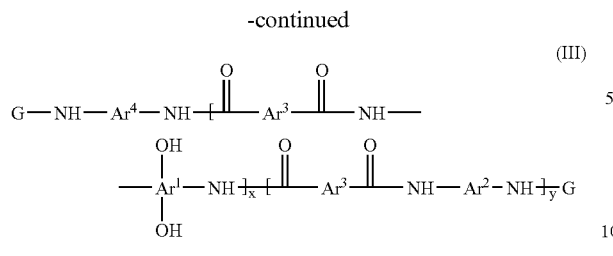
(III)

wherein Ar$^1$ is selected from the group consisting of a tetravalent aromatic group, a tetravalent heterocyclic group and mixtures thereof; Ar$^2$ is selected from the group consisting of a divalent aromatic, a divalent heterocyclic, a divalent alicyclic and a divalent aliphatic group that may contain silicon and mixtures thereof; Ar$^3$ is selected from the group consisting of a divalent aromatic group, a divalent aliphatic group, a divalent heterocyclic group and mixtures thereof; Ar$^4$ is selected from the group consisting of Ar$^1$(OH)$_2$ and Ar$^2$; D is selected from the group consisting of one of the following moieties IIa–IIe:

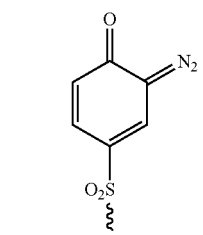
(IIa)

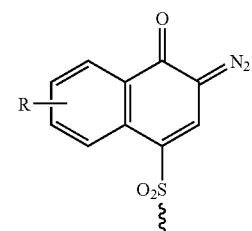
(IIb)

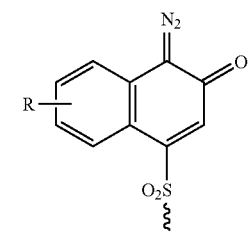
(IIc)

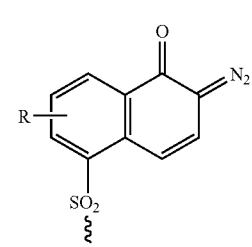
(IId)

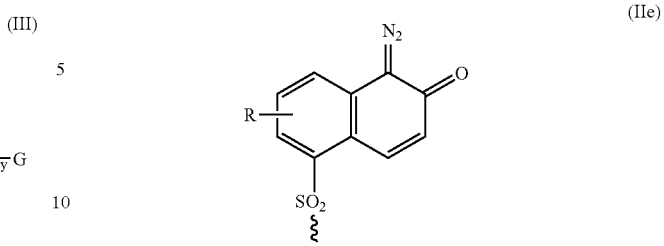
(IIe)

wherein, R is selected from the group consisting of H, a C$_1$–C$_4$ alkyl group, a C$_1$–C$_4$ alkoxy group and a cyclohexyl group; k$^1$ can be any positive value of up to about 0.5, k$^2$ can be any value from about 1.5 to 2 with the proviso that (k$^1$+k$^2$)=2, x is from about 10 to about 1000; y is from about 0 to about 900; and G is an organic group having a carbonyl, carbonyloxy or sulfonyl group attached directly to the terminal NH of the polymer, (b) at least one non-polymeric photosensitive compound comprising a compound having within its structure one or more of moieties selected from the group consisting of IIa–IIe, with the proviso that if a polymer of Structure III is the sole polybenzoxazole precursor polymer, the non-polymeric photosensitive compound is selected from the group consisting of compounds described by structures V–VI,

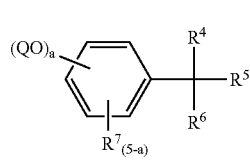
(V)

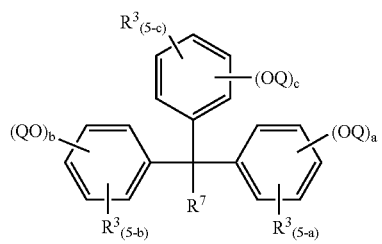
(VI)

wherein R$^1$, R$^2$, R$^4$, R$^5$, R$^6$ and R$^7$ each independently are selected from the group consisting of a linear or branched C$_1$–C$_4$ alkyl group, a phenyl or halide substituted C$_1$–C$_4$ linear or branched alkyl group, a perfluorinated C$_1$–C$_4$ linear or branched alkyl group, a C$_5$–C$_7$ cycloalkyl group, a C$_1$–C$_4$ alkyl or halide substituted C$_5$–C$_7$ cycloalkyl group, or alternatively R$^1$ and R$^2$ or any two of R$^4$, R$^5$, and R$^6$ may together form a 5–7 membered ring; each R$^3$ is independently selected from the group consisting of H, a linear or branched C$_1$–C$_4$ alkyl group, a phenyl or halide substituted C$_1$–C$_4$ linear or branched alkyl group, a perfluorinated linear or branched C$_1$–C$_4$ alkyl group, a C$_5$–C$_7$ cycloalkyl group, a C$_1$–C$_4$ alkyl or halide substituted C$_5$–C$_7$ cycloalkyl group, an unsubstituted phenyl group, and a phenyl or alkyl or halide substituted phenyl group; Q is selected from the group consisting of H or D with the proviso that at least one Q=D; D is selected from the group consisting of one of the moieties IIa–IIe; a is an integer from 1 to 5; b and c are integers from 0 to 5 with the proviso that for Structure VI, if a=b=c=1 and all OQ are para to the triphenyl methane carbon substituent, then at least one $R^3$ is not H; and (c) at least one solvent.

13. A positive photosensitive resin composition according to claim 12, wherein $Ar^1$ is a moiety selected from the group consisting of

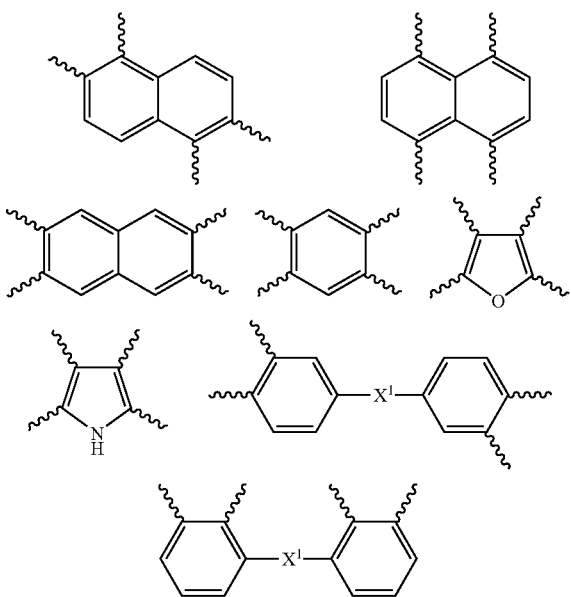

wherein $X^1$ is selected from the group consisting of —O—, —S—, —C(CF$_3$)$_2$—, —CH$_2$—, —SO$_2$—, —NHCO— and —SiR$^9{}_2$— and each $R^9$ is independently selected from the group consisting of a $C_1$–$C_7$ linear or branched alkyl and a $C_5$–$C_8$ cycloalkyl group.

14. A positive photosensitive resin composition according to claim 12, wherein $Ar^1$ is a moiety derived from a reactant selected from the group consisting of 2,2-bis(3-amino-4-hydroxyphenyl)-hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl) propane or mixtures thereof.

15. A positive photosensitive resin composition according to claim 12, wherein $Ar^3$ is a moiety selected from the group consisting of

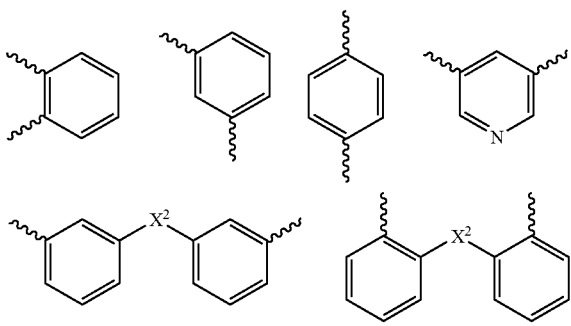

-continued

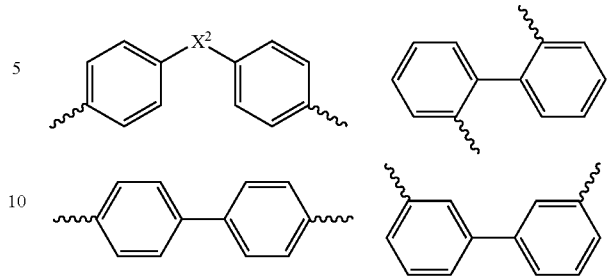

wherein $X^2$ is selected from the group consisting of —O—, —S—, —C(CF$_3$)$_2$—, —CH$_2$—, —SO$_2$— and —NHCO—.

16. A positive photosensitive resin composition according to claim 12, wherein $Ar^3$ is a moiety derived from a reactant selected from the group consisting of 4,4'-diphenyletherdicarboxylic acid, terephthalic acid, isophthalic acid, isophthaloyl dichloride, phthaloyl dichloride, terephthaloyl dichloride, 4,4'-diphenyletherdicarboxylic acid dichloride, dimethylisophthalate, dimethylphthalate, dimethylterphthalate, diethylisophthalate, diethylphthalate, diethylterphthalate and mixtures thereof.

17. A positive photosensitive resin composition according to claim 12, wherein D is selected from the group consisting of the moiety IIb and the moiety IId.

18. A positive photosensitive resin composition according to claim 12, wherein $k^1$ is from about 0.01 to about 0.1.

19. A positive photosensitive resin composition according to claim 12, wherein G is an organic group having a carbonyl group attached directly to the terminal NH of the polybenzoxazole precursor polymer.

20. A positive photosensitive resin composition according to claim 12, wherein G is alkyl carbonyl.

21. A positive photosensitive resin composition according to claim 12, wherein the at least one polybenzoxazole precursor polymer comprises Structure I.

22. A positive photosensitive resin composition according to claim 12, wherein the at least one polybenzoxazole precursor polymer comprises Structure III.

23. A positive photosensitive resin composition according to claim 12, wherein the at least one polybenzoxazole precursor polymer comprises a mixture of Structure I and Structure III.

24. A positive photosensitive resin composition according to claim 21, wherein the at least one non-polymeric photosensitive compound comprises a compound having within its structure a moiety selected from the group consisting of the moiety IIb and the moiety IId.

25. A positive photosensitive resin composition according to claim 22, wherein the at least one non-polymeric photosensitive compound comprises a compound having within its structure a moiety selected from the group consisting of the moiety IIb and the moiety IId.

26. A positive photosensitive resin composition according to claim 23, wherein the at least one non-polymeric photosensitive compound comprises a compound having within its structure a moiety selected from the group consisting of the moiety IIb and the moiety IId.

27. A positive photosensitive resin composition according to claim 21, wherein the at least one non-polymeric photosensitive compound comprises a compound having within its structure a moiety selected from the group consisting of the moiety IIb and or the moiety IId and is selected from the group consisting of compounds described by structures V–VI,

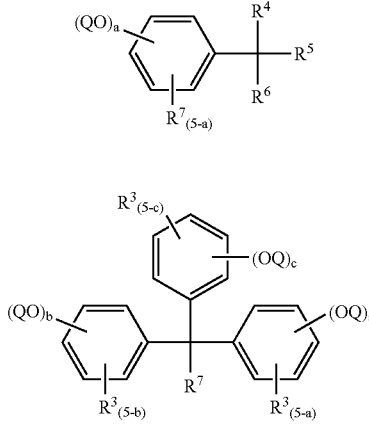

(V)

(VI)

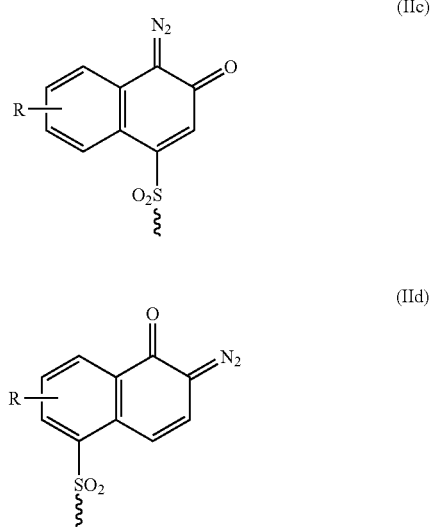

(IIc)

(IId)

(IIe)

wherein, R is selected from the group consisting of H, a $C_1$–$C_4$ alkyl group, a $C_1$–$C_4$ alkoxy group and a cyclohexyl group; a is an integer from 1 to 5; b and c are integers from 0 to 5 with the proviso that for Structure VI, if a=b=c=1 and all OQ are para to the triphenyl methane carbon substituent, then at least one $R^3$ is not H.

wherein $R^1$, $R^2$, $R^4$, $R^5$, $R^6$ and $R^7$ each independently are selected from the group consisting of a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group or alternatively $R^1$ and $R^2$ or any two of $R^4$, $R^5$, and $R^6$ may together form a 5–7 membered ring; each $R^3$ is independently selected from the group consisting of H, a linear or branched $C_1$–$C_4$ alkyl group, a phenyl or halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group, and a phenyl or alkyl or halide substituted phenyl group; Q is selected from the group consisting of H or D with the proviso that at least one Q=D; D is selected from the group consisting of one of the following moieties IIa–IIe:

28. A positive photosensitive resin composition according to claim 21, wherein the non-polymeric photosensitive compound is selected from the group consisting of

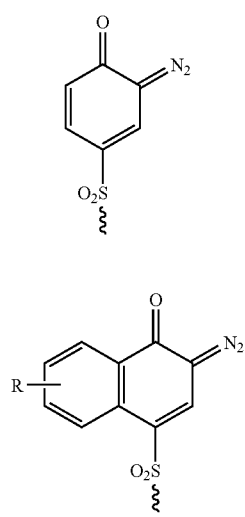

(IIa)

(IIb)

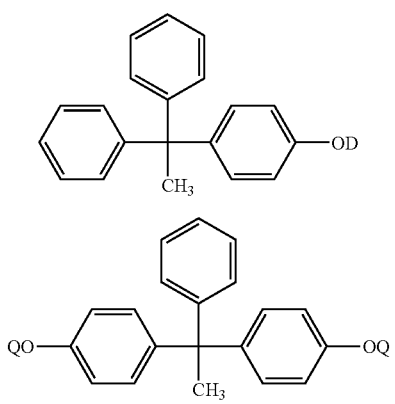

-continued

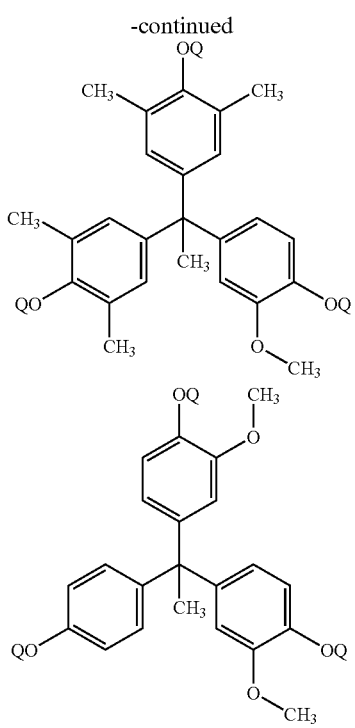

29. A positive photosensitive resin composition according to claim 23, wherein the at least one non-polymeric photosensitive compound comprises a compound having within its structure a moiety selected from the group consisting of the moiety IIb and the moiety IId and is selected from the group consisting of compounds described by structures V–VI,

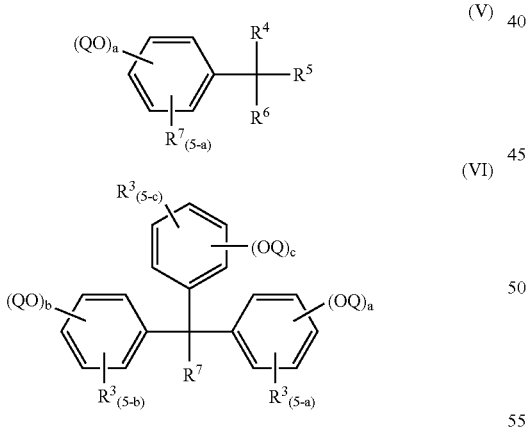

wherein $R^1$, $R^2$, $R^4$, $R^5$, $R^6$ and $R^7$ each independently are selected from the group consisting of a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group, or alternatively $R^1$ and $R^2$ or any two of $R^4$, $R^5$, and $R^6$ may together form a 5–7 membered ring; each $R^3$ is independently selected from the group consisting of H, a linear or branched $C_1$–$C_4$ alkyl group, a phenyl or halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group and a phenyl or alkyl or halide substituted phenyl group; Q is selected from the group consisting of H or D with the proviso that at least one Q=D; D is selected from the group consisting of one of the following moieties IIa–IIe:

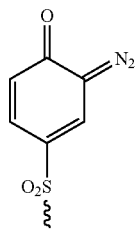
(IIa)

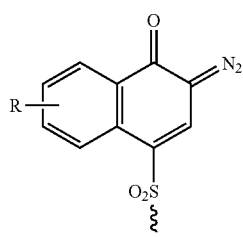
(IIb)

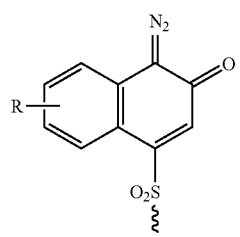
(IIc)

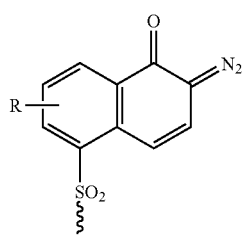
(IId)

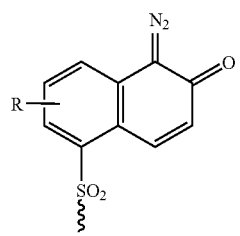
(IIe)

wherein, R is selected from the group consisting of H, a $C_1$–$C_4$ alkyl group, a $C_1$–$C_4$ alkoxy group and a cyclohexyl group; a is an integer from 1 to 5; b and c are integers from 0 to 5 with the proviso that for Structure VI, if a=b=c=1 and all OQ are para to the triphenyl methane carbon substituent, then at least one $R^3$ is not H.

30. A positive photosensitive resin composition according to claim 23, wherein the non-polymeric photosensitive compound is selected from the group consisting of

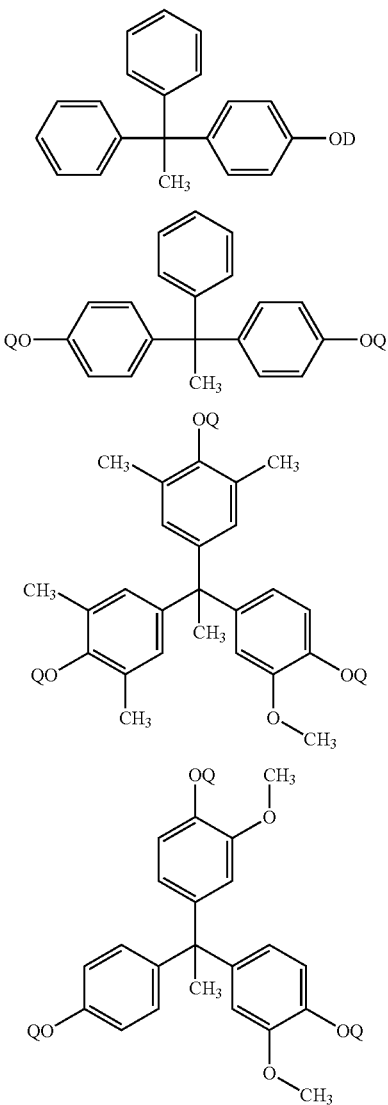

31. A positive photosensitive resin composition according to claim 12, further comprising an adhesion promoter.

32. A positive photosensitive resin composition according to claim 31 wherein the adhesion promoter has the Structure XIII

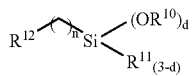 (XIII)

wherein each $R^{10}$ is independently selected from the group consisting of a $C_1$–$C_4$ alkyl group and a $C_5$–$C_7$ cycloalkyl group and each $R^{11}$ is independently selected from the group consisting of a $C_1$–$C_4$ alkyl group, a $C_1$–$C_4$ alkoxy group, a $C_5$–$C_7$ cycloalkyl group and a $C_5$–$C_7$ cycloalkoxy group; d is an integer from 0 to 3 and n is an integer from 1 to about 6 and $R^{12}$ is a moiety selected from the group consisting of one of the following moieties:

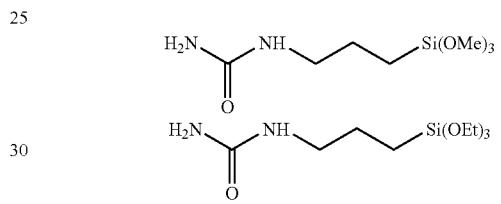

wherein each $R^{13}$ and $R^{14}$ are independently selected from the group consisting of a $C_1$–$C_4$ alkyl group and a $C_5$–$C_7$ cycloalkyl group, and $R^{15}$ is selected from the group consisting of a $C_1$–$C_4$ alkyl group and a $C_5$–$C_7$ cycloalkyl group.

33. A positive photosensitive resin composition according to claim 31 wherein the adhesion promoter is selected from the group consisting of

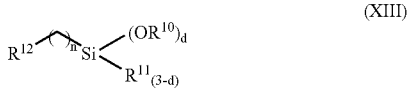

34. A positive photosensitive resin composition according to claim 24 wherein D on the polybenzoxazole precursor polymer is a moiety selected from the group consisting of moiety IIb and moiety IId.

35. A positive photosensitive resin composition according to claim 24 wherein D on the polybenzoxazole precursor polymer is a moiety selected from the group consisting of moiety IIb and moiety IId, G is an organic group having a carbonyl group attached directly to the terminal NH of the polybenzoxazole precursor polymer, and the composition further comprises an adhesion promoter having the structure

 (XIII)

wherein each $R^{10}$ is independently selected from the group consisting of a $C_1$–$C_4$ alkyl group and a $C_5$–$C_7$ cycloalkyl group and each $R^{11}$ is independently selected from the group consisting of a $C_1$–$C_4$ alkyl group, a $C_1$–$C_4$ alkoxy group, a $C_5$–$C_7$ cycloalkyl group and a $C_5$–$C_7$ cycloalkoxy group; d is an integer from 0 to 3 and n is an integer from 1 to about 6 and $R^{12}$ is selected from the group consisting of one of the following moieties:

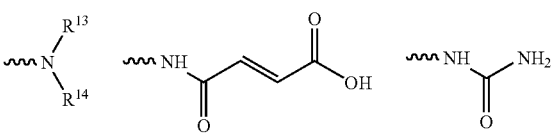

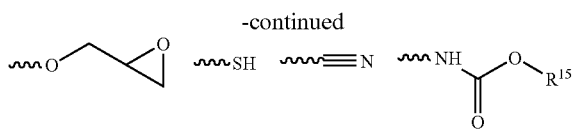

wherein each $R^{13}$ and $R^{14}$ are independently selected from the group consisting of a $C_1$–$C_4$ alkyl group or a $C_5$–$C_7$ cycloalkyl group, and $R^{15}$ is a $C_1$–$C_4$ alkyl group and a $C_5$–$C_7$ cycloalkyl group.

36. A positive photosensitive resin composition according to claim 25 wherein G is an organic group having a carbonyl group attached directly to the terminal NH of the polybenzoxazole precursor polymer, and the composition further comprises an adhesion promoter having the structure

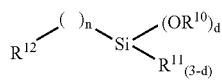

(XIII)

wherein each $R^{10}$ is independently selected from the group consisting of a $C_1$–$C_4$ alkyl group and a $C_5$–$C_7$ cycloalkyl group and each $R^{11}$ is independently selected from the group consisting of a $C_1$–$C_4$ alkyl group, a $C_1$–$C_4$ alkoxy group, a $C_5$–$C_7$ cycloalkyl group and a $C_5$–$C_7$ cycloalkoxy group; d is an integer from 0 to 3 and n is an integer from 1 to about 6 and $R^{12}$ is a moiety selected from the group consisting of one of the following moieties:

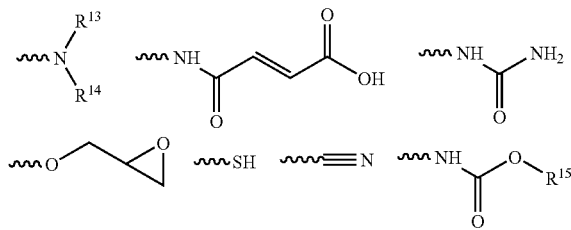

wherein each $R^{13}$ and $R^{14}$ are independently selected from the group consisting of a $C_1$–$C_4$ alkyl group and a $C_5$–$C_7$ cycloalkyl group, and $R^{15}$ is selected from the group consisting of a $C_1$–$C_4$ alkyl group and a $C_5$–$C_7$ cycloalkyl group.

37. A positive photosensitive resin composition according to claim 26 wherein D on the polybenzoxazole precursor polymer is a moiety selected from the group consisting of moiety IIb and moiety IId, G is an organic group having a carbonyl group attached directly to the terminal NH of the polybenzoxazole precursor polymer, and the composition further comprises an adhesion promoter having the structure

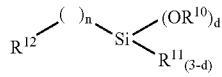

(XIII)

wherein each $R^{10}$ is independently selected from the group consisting of a $C_1$–$C_4$ alkyl group and a $C_5$–$C_7$ cycloalkyl group and each $R^{11}$ is independently selected from the group consisting of a $C_1$–$C_4$ alkyl group, a $C_1$–$C_4$ alkoxy group, a $C_5$–$C_7$ cycloalkyl group and a $C_5$–$C_7$ cycloalkoxy group; d is an integer from 0 to 3 and n is an integer from 1 to about 6 and $R^{12}$ is a moiety selected from the group consisting of one of the following moieties:

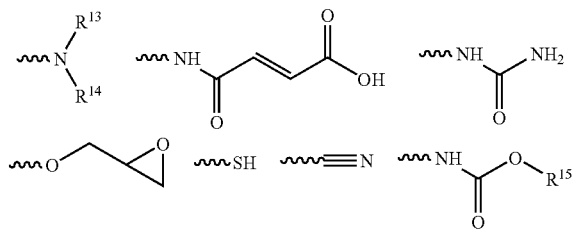

wherein each $R^{13}$ and $R^{14}$ are independently selected from the group consisting of a $C_1$–$C_4$ alkyl group and a $C_5$–$C_7$ cycloalkyl group, and $R^{15}$ is selected from the group consisting of a $C_1$–$C_4$ alkyl group and a $C_5$–$C_7$ cycloalkyl group.

38. A process for forming a patterned image on a substrate, the process comprises the steps of:
  (a) coating on a suitable substrate, a positive-working photosensitive composition of claim 12 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

39. A process for forming a patterned image on a substrate, the process comprises the steps of:
  (a) coating on a suitable substrate, a positive-working photosensitive composition of claim 17 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

40. A process for forming a patterned image on a substrate, the process comprises the steps of:
  (a) coating on a suitable substrate, a positive-working photosensitive composition of claim 25 thereby forming a coated substrate;
  (b) prebaking the coated substrate;
  (c) exposing the prebaked coated substrate to actinic radiation;
  (d) developing the exposed coated substrate with an aqueous developer, thereby forming an uncured relief image on the coated substrate; and
  (e) baking the developed coated substrate at an elevated temperature, thereby curing the relief image.

41. A process for forming a patterned image on a substrate, the process comprises the steps of:
  (a) coating on a suitable substrate, a positive-working photosensitive composition of claim 27 thereby forming a coated substrate;
  (b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

42. A process for forming a patterned image on a substrate, the process comprises the steps of:

(a) coating on a suitable substrate, a positive-working photosensitive composition of claim 28 thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

43. A process for forming a patterned image on a substrate, the process comprises the steps of:

(a) coating on a suitable substrate, a positive-working photosensitive composition of claim 29 thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (d) baking the developed coated substrate at an elevated temperature, thereby curing the relief image.

44. A process for forming a patterned image on a substrate, the process comprises the steps of:

(a) coating on a suitable substrate, a positive-working photosensitive composition of claim 31 thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

45. A process for forming a patterned image on a substrate, the process comprises the steps of:

(a) coating on a suitable substrate, a positive-working photosensitive composition of claim 32 thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

46. A process for forming a patterned image on a substrate, the process comprises the steps of:

(a) coating on a suitable substrate, a positive-working photosensitive composition of claim 33 thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

47. A process for forming a patterned image on a substrate, the process comprises the steps of:

(a) coating on a suitable substrate, a positive-working photosensitive composition of claim 36 thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

48. A process for forming a patterned image on a substrate, the process comprises the steps of:

(a) coating on a suitable substrate, a positive-working photosensitive composition of claim 38 thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

49. A substrate having a patterned image produced by the process of claim 38.

50. A substrate having a patterned image produced by the process of claim 39.

51. A substrate having a patterned image produced by the process of claim 40.

52. A substrate having a patterned image produced by the process of claim 41.

53. A substrate having a patterned image produced by the process of claim 42.

54. A substrate having a patterned image produced by the process of claim 43.

55. A substrate having a patterned image produced by the process of claim 44.

56. A substrate having a patterned image produced by the process of claim 45.

57. A substrate having a patterned image produced by the process of claim 46.

58. A substrate having a patterned image produced by the process of claim 47.

59. A substrate having a patterned image produced by the process of claim 48.

60. A positive photosensitive resin composition comprising:

(a) at least one polybenzoxazole precursor polymer having Structure I:

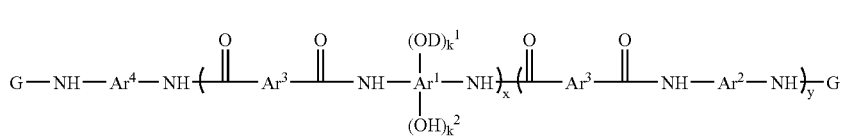

(I)

and optionally at least one polybenzoxazole precursor polymer having Structure III

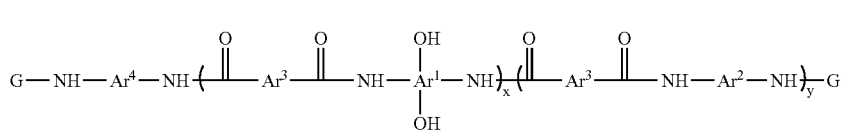

(III)

wherein $Ar^1$ is selected from the group consisting of a tetravalent aromatic group, a tetravalent heterocyclic group and mixtures thereof; $Ar^2$ is selected from the group consisting of a divalent aromatic, a divalent heterocyclic, a divalent alicyclic and a divalent aliphatic group that may contain silicon and mixtures thereof; $Ar^3$ is selected from the group consisting of a divalent aromatic group, a divalent aliphatic group, a divalent heterocyclic group and mixtures thereof; $Ar^4$ is selected from the group consisting of $Ar^1$ $(OH)_2$ and $Ar^2$; D is selected from the group consisting of one of the following moieties IIa–IIe:

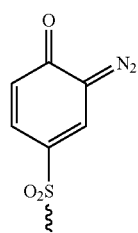

(IIa)

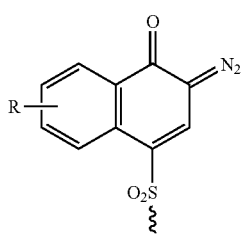

(IIb)

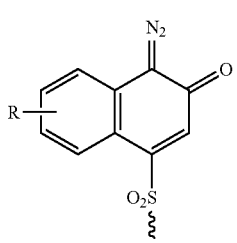

(IIc)

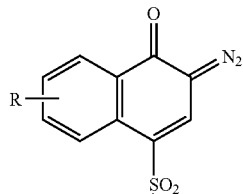

(IId)

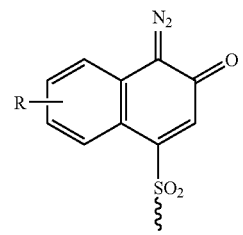

(IIe)

wherein, R is selected from the group consisting of H, a $C_1$–$C_4$ alkyl group, a $C_1$–$C_4$ alkoxy group and a cyclohexyl group; $k^1$ can be any positive value of up to about 0.5, $k^2$ can be any value from about 1.5 to 2 with the proviso that $(k^1+k^2)=2$, x is from about 10 to about 1000; y is from about 0 to about 900; and G is an organic group having a carbonyl, carbonyloxy or sulfonyl group attached directly to the terminal NH of the polymer, (b) at least one non-polymeric photosensitive compound comprising a compound described by structure IV,

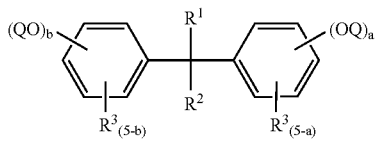

(IV)

wherein $R^1$ and $R^2$ are each independently are selected from the group consisting of a linear or branched $C_1$–$C_4$ alkyl group, a phenyl or halide substituted $C_1$–$C_4$ linear or branched alkyl group, a perfluorinated $C_1$–$C_4$ linear or branched alkyl group, a $C_5$–$C_7$ cycloalkyl group, a $C_1$–$C_4$ alkyl or halide substituted $C_5$–$C_7$ cycloalkyl group, or alternatively $R^1$ and $R^2$ may together form a 5–7 membered ring; each $R^3$ is independently selected from the group consisting of H, a linear or branched $C_1$–$C_4$ alkyl group, a phenyl or halide substituted $C_1$–$C_4$ linear or branched alkyl group, a perfluorinated linear or branched $C_1$–$C_4$ alkyl group, a $C_5$–$C_7$ cycloalkyl group, a $C_1$–$C_4$ alkyl or halide substituted $C_5$–$C_7$ cycloalkyl group, an unsubstituted phenyl group, and a phenyl or alkyl or halide substituted phenyl group; Q is selected from the group consisting of H or D with the proviso that at least one Q=D; D is selected from the group consisting of one of the moieties IIa–IIe; a is an integer from 1 to 5; b is an integers from 0 to 5; and (c) at least one solvent.

61. A positive photosensitive resin composition according to claim 60, wherein $Ar^1$ is a moiety selected from the group consisting of

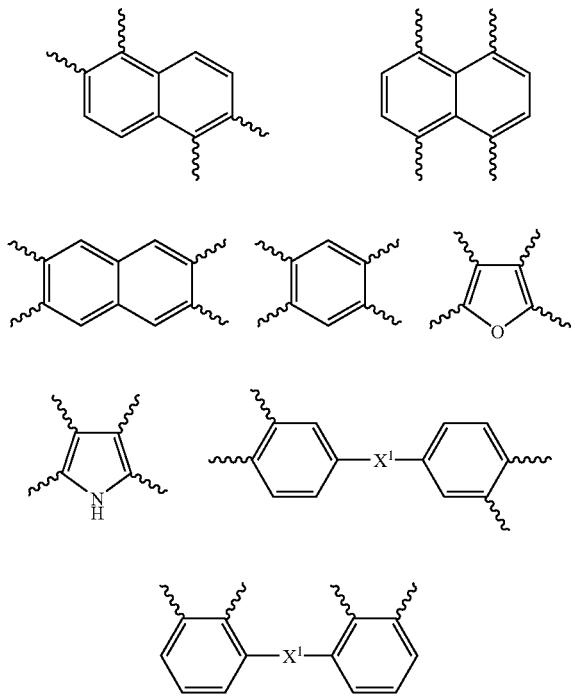

wherein $X^1$ is selected from the group consisting of —O—, —S—, —C(CF$_3$)$_2$—, —CH$_2$—, —SO$_2$—, —NHCO— and —SiR$^9$$_2$— and each $R^9$ is independently selected from the group consisting of a $C_1$–$C_7$ linear or branched alkyl and a $C_5$–$C_8$ cycloalkyl group.

62. A positive photosensitive resin composition according to claim 60, wherein $Ar^1$ is a moiety derived from a reactant selected from the group consisting of 2,2-bis(3-amino-4-hydroxyphenyl)-hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl) propane or mixtures thereof.

63. A positive photosensitive resin composition according to claim 60, wherein $Ar^3$ is a moiety selected from the group consisting of

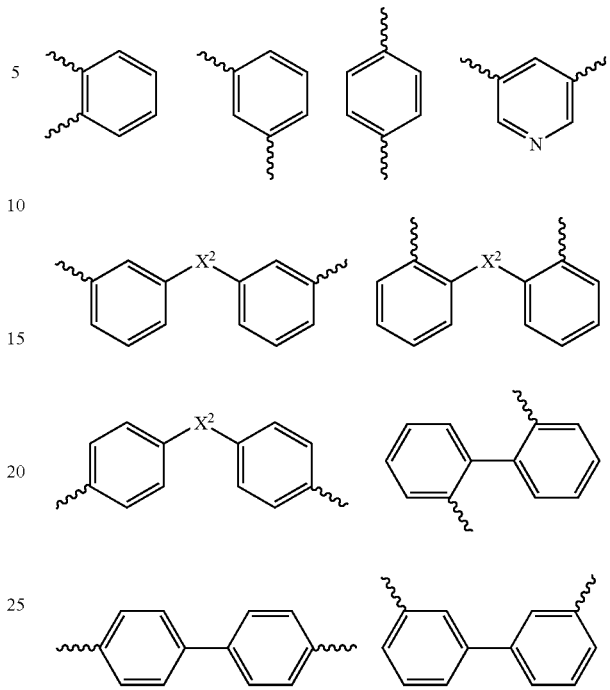

wherein $X^2$ is selected from the group consisting of —O—, —S—, —C(CF$_3$)$_2$—, —CH$_2$—, —SO$_2$— and —NHCO—.

64. A positive photosensitive resin composition according to claim 60 wherein $Ar^3$ is a moiety derived from a reactant selected from the group consisting of 4,4'-diphenyletherdicarboxylic acid, terephthalic acid, isophthalic acid, isophthaloyl dichloride, phthaloyl dichloride, terephthaloyl dichloride, 4,4'-diphenyletherdicarboxylic acid dichloride, dimethylisophthalate, dimethylphthalate, dimethylterephthalate, diethylisophthalate, diethylphthalate, diethylterephthalate and mixtures thereof.

65. A positive photosensitive resin composition according to claim 60, wherein D is selected from the group consisting of the moiety IIb and the moiety IId.

66. A positive photosensitive resin composition according to claim 60, wherein $k^1$ is from about 0.01 to about 0.1.

67. A positive photosensitive resin composition according to claim 60, wherein G is an organic group having a carbonyl group attached directly to the terminal NH of the polybenzoxazole precursor polymer.

68. A positive photosensitive resin composition according to claim 60, wherein G is alkyl carbonyl.

69. A positive photosensitive resin composition according to claim 60, wherein the at least one polybenzoxazole precursor polymer comprises a mixture of Structure I and Structure III.

70. A positive photosensitive resin composition according to claim 60 wherein the composition additionally comprises an adhesion promoter of Structure XIII

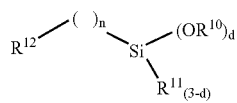

wherein each $R^{10}$ is independently selected from the group consisting of a $C_1$–$C_4$ alkyl group and a $C_5$–$C_7$ cycloalkyl group and each $R^{11}$ is independently selected from the group consisting of a $C_1$–$C_4$ alkyl group, a $C_1$–$C_4$ alkoxy group, a $C_5$–$C_7$ cycloalkyl group and a $C_5$–$C_7$ cycloalkoxy group; d is an integer from 0 to 3 and n is an integer from 1 to about 6 and $R^{12}$ is a moiety selected from the group consisting of one of the following moieties:

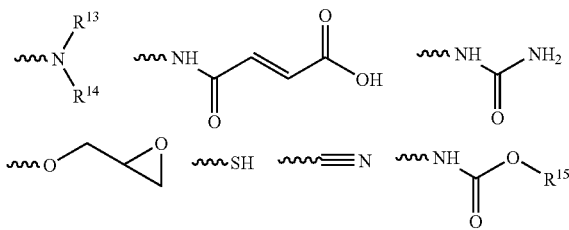

wherein each $R^{13}$ and $R^{14}$ are independently selected from the group consisting of a $C_1$–$C_4$ alkyl group and a $C_5$–$C_7$ cycloalkyl group, and $R^{15}$ is selected from the group consisting of a $C_1$–$C_4$ alkyl group and a $C_5$–$C_7$ cycloalkyl group.

71. A positive photosensitive resin composition according to claim 70 wherein the adhesion promoter is selected from the group consisting of

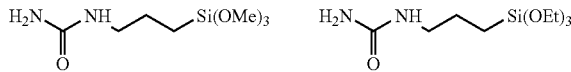

72. A process for forming a patterned image on a substrate, the process comprises the steps of:
   (a) coating on a suitable substrate, a positive-working photosensitive composition of claim 60 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

73. A process for forming a patterned image on a substrate, the process comprises the steps of:
   (a) coating on a suitable substrate, a positive-working photosensitive composition of claim 65 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

74. A process for forming a patterned image on a substrate, the process comprises the steps of:
   (a) coating on a suitable substrate, a positive-working photosensitive composition of claim 68 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

75. A process for forming a patterned image on a substrate, the process comprises the steps of:
   (a) coating on a suitable substrate, a positive-working photosensitive composition of claim 69 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

76. A process for forming a patterned image on a substrate, the process comprises the steps of:
   (a) coating on a suitable substrate, a positive-working photosensitive composition of claim 69 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

77. A process for forming a patterned image on a substrate, the process comprises the steps of:
   (a) coating on a suitable substrate, a positive-working photosensitive composition of claim 70 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

78. A substrate having a patterned image produced by the process of claim 72.

79. A substrate having a patterned image produced by the process of claim 77.

* * * * *